(12) United States Patent
Kawada et al.

(10) Patent No.: US 7,868,521 B2
(45) Date of Patent: Jan. 11, 2011

(54) PIEZOELECTRIC OSCILLATOR AND CASE HAVING AN INTEGRAL ELECTRICAL TERMINAL

(75) Inventors: Yasuo Kawada, Chiba (JP); Masashi Numata, Chiba (JP)

(73) Assignee: Seiko Instruments Inc., Chiba (JP)

( * ) Notice: Subject to any disclaimer, the term of this patent is extended or adjusted under 35 U.S.C. 154(b) by 246 days.

(21) Appl. No.: 12/188,726

(22) Filed: Aug. 8, 2008

(65) Prior Publication Data
US 2009/0039737 A1 Feb. 12, 2009

(30) Foreign Application Priority Data
Aug. 10, 2007 (JP) ............... 2007-209102

(51) Int. Cl.
*H01L 41/053* (2006.01)
(52) U.S. Cl. .................. 310/344; 310/348; 310/370
(58) Field of Classification Search ............ 310/344, 310/348, 370
See application file for complete search history.

(56) References Cited

U.S. PATENT DOCUMENTS

| | | | |
|---|---|---|---|
| 2,577,576 A * | 12/1951 | Glickman et al. | 310/344 |
| 3,697,766 A * | 10/1972 | Ganter et al. | 310/348 |
| 3,795,831 A * | 3/1974 | Fujita | 310/370 |
| 4,035,673 A * | 7/1977 | Ishida et al. | 310/344 |
| 4,131,816 A * | 12/1978 | Nakata | 310/348 |
| 4,384,232 A * | 5/1983 | Debely | 310/370 |
| 5,216,315 A * | 6/1993 | Terada et al. | 310/329 |
| 5,277,694 A * | 1/1994 | Leysieffer et al. | 600/25 |
| 5,607,236 A * | 3/1997 | Takagi et al. | 310/370 |
| 5,854,427 A * | 12/1998 | Terada et al. | 310/370 |
| 5,918,354 A * | 7/1999 | Ikegami et al. | 310/340 |
| 6,927,530 B2 * | 8/2005 | Tanaya et al. | 310/348 |
| 7,511,405 B2 * | 3/2009 | Numata et al. | 310/344 |
| 7,719,171 B2 * | 5/2010 | Oku et al. | 310/344 |
| 7,755,259 B2 * | 7/2010 | Uetake et al. | 310/344 |
| 2005/0140252 A1 * | 6/2005 | Miyata et al. | 310/370 |
| 2007/0090727 A1 * | 4/2007 | Uetake et al. | 310/344 |
| 2008/0129149 A1 * | 6/2008 | Numata et al. | 310/344 |

FOREIGN PATENT DOCUMENTS

JP 2002-043886 2/2002

* cited by examiner

*Primary Examiner*—J. SanMartin
(74) *Attorney, Agent, or Firm*—Brinks Hofer Gilson & Lione

(57) ABSTRACT

A method of fabricating a case accommodating a piezoelectric vibrating piece therein in a piezoelectric oscillator including the piezoelectric vibrating piece, including the steps of: applying deep drawing to a conductive plate member to shape the plate member in a nearly cylindrical shape with a bottom; pressing an inner surface of a bottom part of the plate member by a punch for step drawing while an outer surface of the bottom part is being abutted against a surface including an opening of a hole of a die having an inner diameter smaller than the outer diameter of the bottom part, whereby a projecting portion is formed on the outer surface of the bottom part; and cutting the plate member having the projecting portion at a predetermined position on the opening side thereof, whereby a case in a nearly cylindrical shape with a bottom having the projecting portion is obtained.

5 Claims, 24 Drawing Sheets

FIG. 20
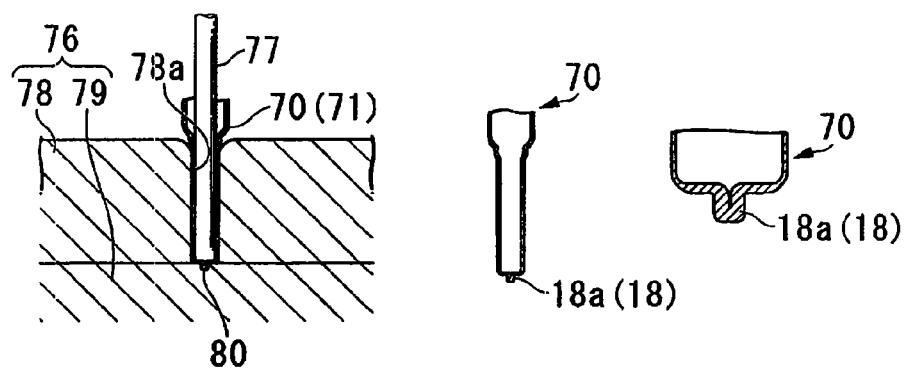
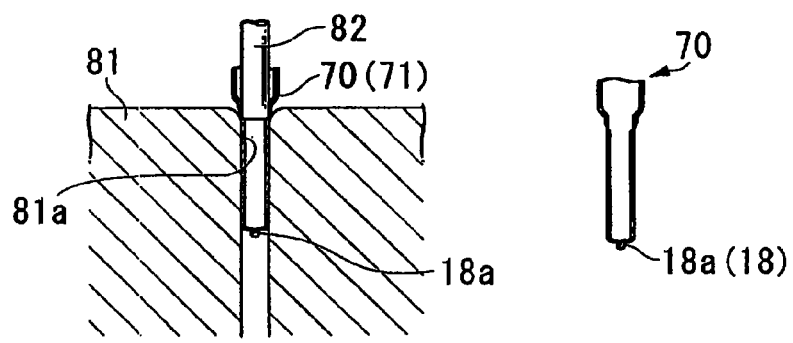
FIG. 21A
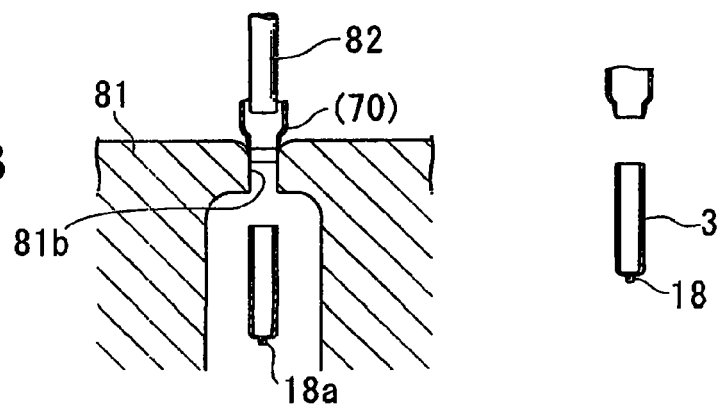
FIG. 21B

PIEZOELECTRIC OSCILLATOR AND CASE HAVING AN INTEGRAL ELECTRICAL TERMINAL

RELATED APPLICATIONS

This application claims priority under 35 U.S.C. §119 to Japanese Patent Application No. JP2007-209102 filed on Aug. 10, 2007, the entire content of which is hereby incorporated by reference.

BACKGROUND OF THE INVENTION

1. Field of the Invention

The present invention relates to a method of fabricating a case accommodating a piezoelectric vibrating piece in a piezoelectric oscillator including the piezoelectric vibrating piece and a piezoelectric oscillator including a case obtained by the method, and an oscillator, an electronic appliance, and a radio clock including the piezoelectric oscillator.

2. Description of the Related Art

In recent years, mobile telephones and portable information terminal devices employ a piezoelectric oscillator using quartz crystal as a time source, a timing source of control signals, and a reference signal source. As this type of piezoelectric oscillator, various ones are offered. As one of them, a cylinder package piezoelectric oscillator formed in a nearly cylindrical shape is known.

In the cylinder package piezoelectric oscillator like this, two leads are extended from the opening of a case that hermetically seals a piezoelectric vibrating piece therein, whereby an excitation electrode provided on each of two surfaces of the piezoelectric vibrating piece can be connected to outside.

This type of piezoelectric oscillator is mounted on various electronic appliances. However, since these electronic appliances are being reduced in size year after year, also in the piezoelectric oscillator, further size reduction is demanded. In order to reduce the size of the piezoelectric oscillator, it is effective to reduce the outer diameter of the ring. To this end, it is necessary to reduce the diameters of two leads. However, in the case in which the leads are made narrower than the current form, the stiffness is decreased, and then it is likely to deform the leads in the process of fabrication. Particularly, the outer lead portions that are longer than the inner lead portions tend to become deformed. When the outer lead portions become deformed, they cannot maintain themselves in the state of being parallel with each other. Thus, the quality is degraded, and the oscillator cannot be used as a product. Consequently, it is likely to cause a reduction in yields.

In addition, in the process of fabrication, the outer lead portions are entangled with the outer lead portions of another hermetic terminal, which might temporarily stop the production line. Also in this point, it is likely to cause a reduction in yields. Particularly, the more size reduction is aimed, the more the problems might occur noticeably. On this account, in the fabricating method under present conditions, it is difficult to fabricate a piezoelectric oscillator of high yields and high quality which can be further reduced in size.

Then, a piezoelectric oscillator is provided which has a hermetic terminal with a single lead, not two leads (see Patent Reference 1 (see JP-A-2002-43886)). In other words, in the piezoelectric oscillator, the lead and a case (metal cap) are formed to make a pair of terminals, and only one lead is extended while two leads are extended from the opening of a case in the technique before.

In the piezoelectric oscillator described in Patent Reference 1, for example, a metal terminal is mounted on the case (metal cap) to facilitate electrical connection to outside. In the case in which the metal terminal is connected to the case in this manner, they are generally connected to each other with solder. However, the case is formed of a metal because the case is desired to be conductive, and the case thus has large heat capacity. Therefore, it is necessary to heat the entire case to some extent when the metal terminal is soldered to the case, and on this account, the soldering process is difficult, which is a cause that hinders facilitation of manufacture of the piezoelectric oscillator itself.

SUMMARY OF THE INVENTION

The invention is made in the light of circumstances. An object is to particularly provide a method of fabricating a case by which a case having a terminal can be readily fabricated, a piezoelectric oscillator including a case obtained by the method, and an oscillator, an electronic appliance, and a radio clock which include the piezoelectric oscillator.

In order to solve the problem, the invention proposes the following schemes.

A method of fabricating a case according to the invention is a method of fabricating a case accommodating a piezoelectric vibrating piece therein in a piezoelectric oscillator including the piezoelectric vibrating piece, the method including the steps of: applying deep drawing to a plate member formed of a conductive material to shape the plate member in a nearly cylindrical shape with a bottom; pressing an inner surface of a bottom part of the plate member by a punch for step drawing while an outer surface of the bottom part of the plate member shaped into a nearly cylindrical shape with a bottom in the deep drawing step is being abutted against a surface including an opening of a recessed part or hole of a die having the recessed part or hole with an inner diameter smaller than the outer diameter of the bottom part, whereby a projecting portion is formed on the outer surface of the bottom part; and cutting the plate member in a nearly cylindrical shape with a bottom having the projecting portion formed in the step drawing step at a predetermined position on the opening side thereof, whereby a case in a nearly cylindrical shape with a bottom having the projecting portion is obtained.

According to the method of fabricating a case, the plate member is subjected to the deep drawing step and then the step drawing step, and a projecting portion can be formed on the bottom part outer surface of the plate member in a nearly cylindrical shape with a bottom. Then, after the cutting step, a case in a nearly cylindrical shape with a bottom having the projecting portion can be obtained. Therefore, the projecting portion is allowed to function as a terminal part, whereby the soldering process before is not required.

In addition, in the method of fabricating a case, preferably, in the step drawing step, the projecting portion is formed to have a length longer than a desired length, and after the step drawing step, the step of adjusting the length of the projecting portion to a desired length is provided.

With this configuration, in fabricating a large number of the cases, the length of the projecting portion can be made uniform in a desired length with no variations.

In addition, in the method of fabricating a case, preferably, in the adjusting step, a die is used which includes a hole having a desired depth corresponding to the desired length and a predetermined inner diameter, the projecting portion longer than the desired length is inserted into the hole, and in this state, the inner surface of the bottom part of the plate member is pressed by a punch, whereby the projecting portion is compressed to the desired length.

With this configuration, the projecting portion is compressed to form the length in a desired length as well as the thickness can be adjusted to the inner diameter the die. Thus, the length and outer diameter of the projecting portion to be obtained can be readily adjusted to dimensions set in advance.

In addition, in the method of fabricating a case, preferably, the plate member has a continuous belt shape for forming a plurality of cases.

With this configuration, the plate member can be in turn processed while a holding member in a belt shape is being moved in the length direction, whereby the manufacture of the case can be automated highly efficiently (at high speed).

In addition, in the method of fabricating a case, preferably, the plate member is a plate member after plated.

With this configuration, through the deep drawing step and the step drawing step, a plated case can be obtained. Thus, as compared with the case in which the obtained cases are plated individually, plating can be performed more efficiently, easily.

In addition, in the method of fabricating a case, preferably, the plate member has a thickness of 0.12 μm.

A piezoelectric oscillator according to the invention is a piezoelectric oscillator including: a piezoelectric vibrating piece, a case having an opening for accommodating the piezoelectric vibrating piece therein; and a hermetic terminal having an annular ring, a lead arranged to penetrate through the ring in which one end side thereof is an inner lead portion electrically connected to a piezoelectric vibrating piece and the other end side thereof is an outer lead portion electrically connected to outside as the ring is between them, and a filler fixing the lead to the ring, wherein the hermetic terminal seals the piezoelectric vibrating piece inside a case, wherein the case is obtained by the method of fabricating a case described above.

According to the piezoelectric oscillator, a case in a nearly cylindrical shape with a bottom having a projecting portion is fabricated with no soldering. Therefore, since the manufacture of the case can be facilitated, the manufacture of the piezoelectric oscillator itself can be facilitated as well.

In addition, since a projecting portion is provided on the case formed of a conductive material, the projecting portion of the case and the one lead can be formed in a pair of the terminals. Therefore, since the lead is a single lead, even though the outer diameter of the ring is made smaller, it is unnecessary to reduce the diameter of the lead as compared with the case of two leads, and it is unlikely that leads are entangled with each other in the process of fabrication, which allows the size reduction of the piezoelectric oscillator itself.

In addition, an oscillator according to the invention includes the piezoelectric oscillator connected to an integrated circuit as an oscillating element.

In addition, an electronic appliance according to the invention includes the piezoelectric oscillator.

In addition, a radio clock according to the invention includes the piezoelectric oscillator electrically connected to a filter part.

In accordance with the oscillator, the electronic appliance, and the radio clock according to the invention, since they include the piezoelectric oscillator which can facilitate manufacture and can be reduced in size, the manufacture of the oscillator, the electronic appliance, and the radio clock themselves can be facilitated, and the size can be reduced.

In accordance with the method of fabricating a case according to the invention, since the projecting portion is formed on the case in one piece with no soldering, particularly, the fabrication process steps of the projecting portion can be facilitated.

In accordance with the piezoelectric oscillator according to the invention, the case that can be fabricated easily is used, and the manufacture of the piezoelectric oscillator itself can be facilitated. Furthermore, since the lead is a single lead, the piezoelectric oscillator itself can be reduced in size.

In accordance with the oscillator, the electronic appliance, and the radio clock according to the invention, since they include the piezoelectric oscillator which can facilitate manufacture and can be reduced in size, the manufacture of the oscillator, the electronic appliance, and the radio clock themselves can be facilitated, and the size can be reduced.

BRIEF DESCRIPTION OF THE DRAWINGS

FIG. 20 shows an illustration depicting an adjusting step in the fabrication process steps of the piezoelectric oscillator according to the first embodiment of the invention;

FIGS. 21A and 21B each show an illustration depicting a cutting step in the fabrication process steps of the piezoelectric oscillator according to the first embodiment of the invention;

DETAILED DESCRIPTION OF THE INVENTION

First Embodiment

Figure 1:
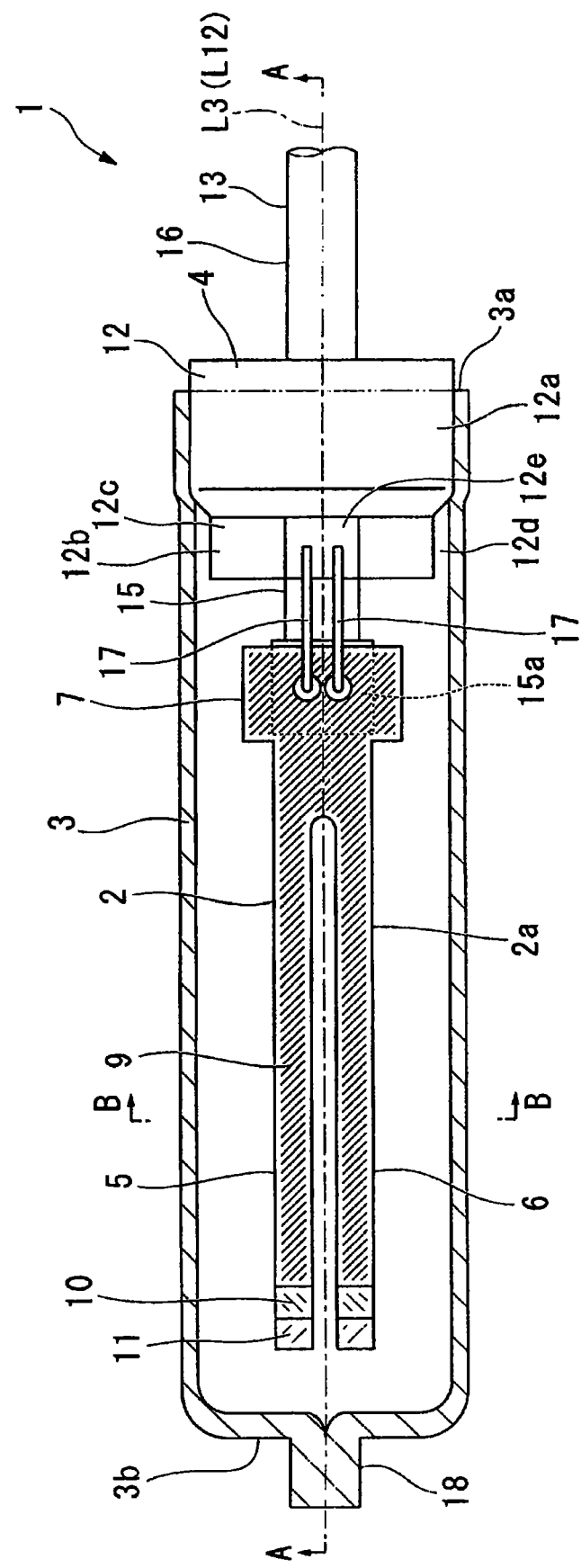
FIG. 1 shows a top view depicting the piezoelectric oscillator according to a first embodiment of the invention.
Figure 2:
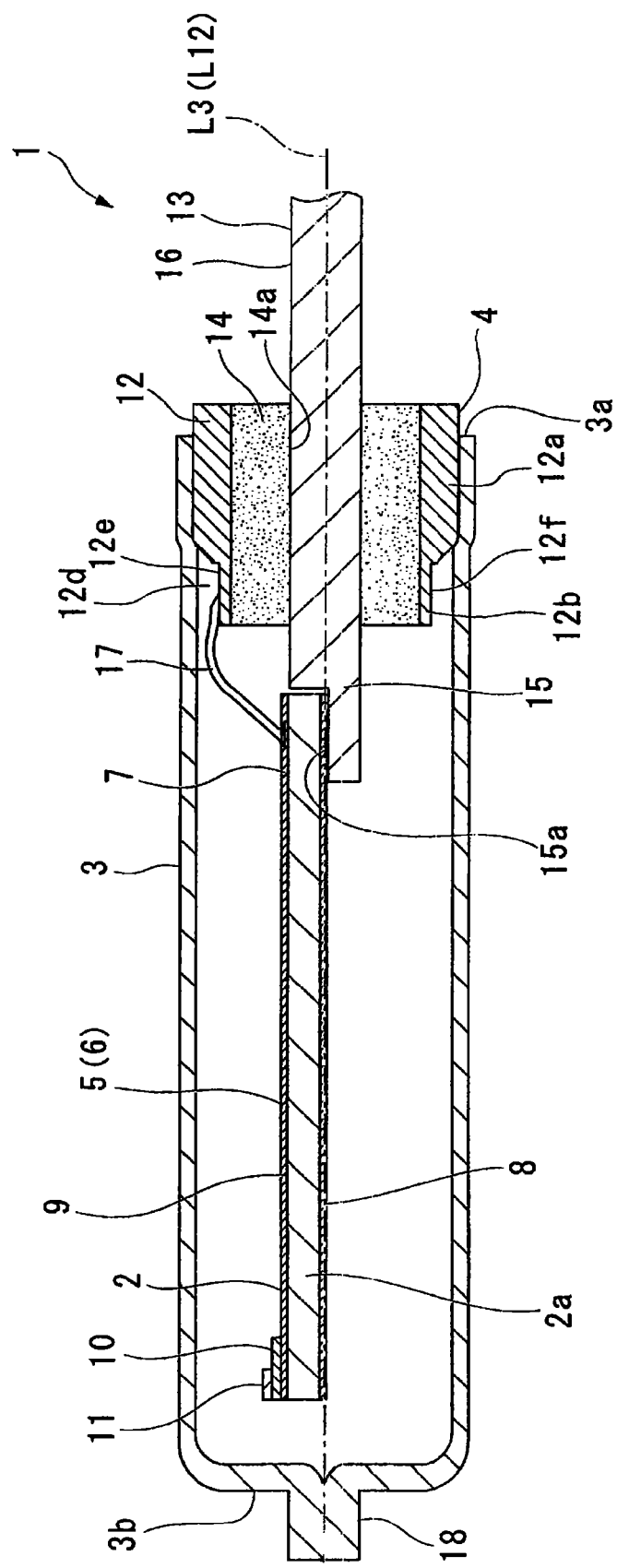
FIG. 2 shows a cross section in a cutting line A-A in FIG. 1 depicting the piezoelectric oscillator according to the first embodiment of the invention.
Figure 3:
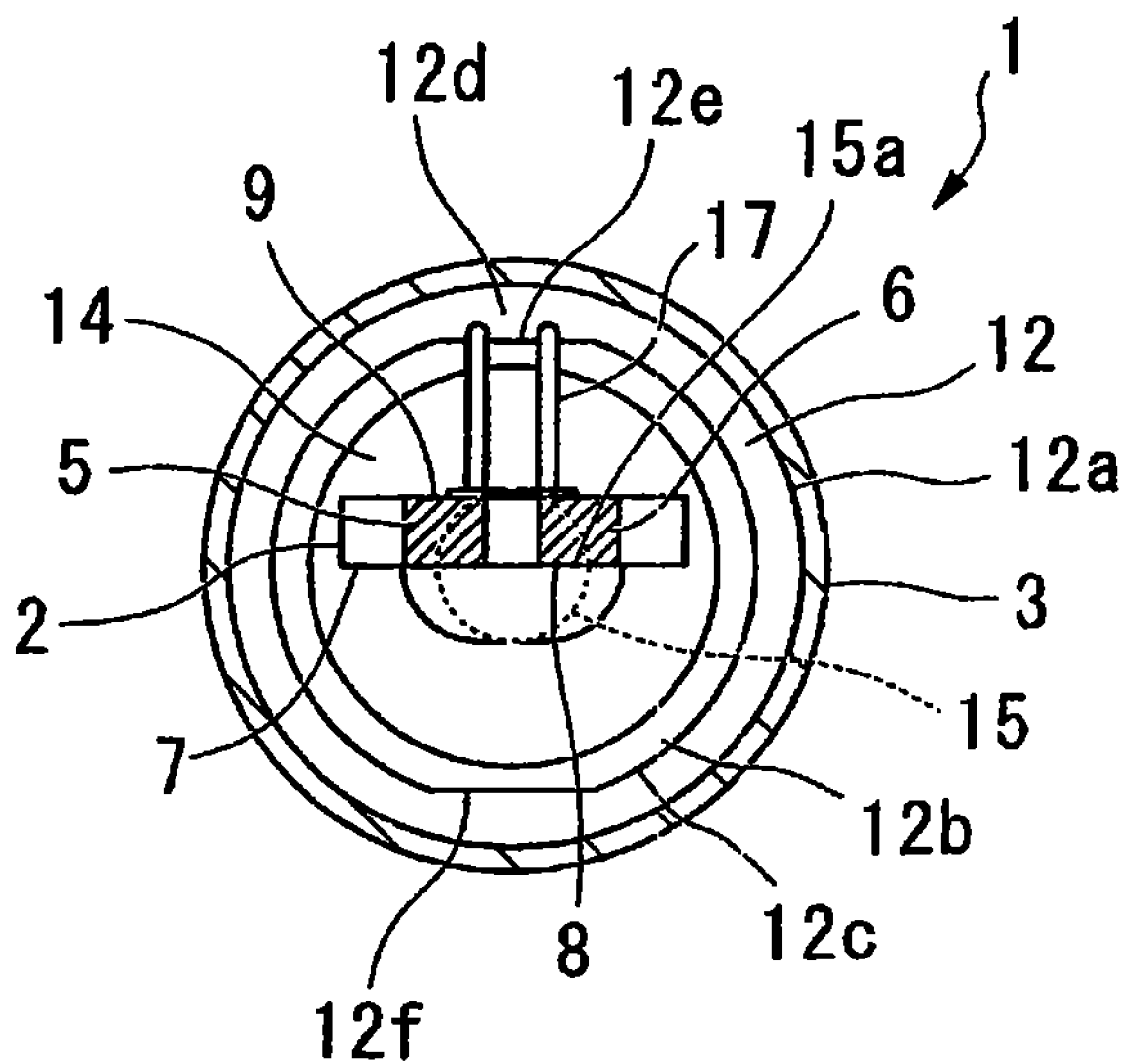
FIG. 3 shows a cross section in a cutting line B-B in FIG. 1 depicting the piezoelectric oscillator according to the first embodiment of the invention.

FIGS. 1 to 3 each show a diagram depicting a piezoelectric oscillator according to a first embodiment of the invention. FIG. 1 shows a cross sectional side view depicting the piezoelectric oscillator according to the embodiment overall, FIG. 2 shows a cross section depicting line A-A shown in FIG. 1, and FIG. 3 shows a cross section depicting line B-B shown in FIG. 1.

As shown in FIGS. 1 to 3, a piezoelectric oscillator 1 according to the embodiment is a cylinder package piezoelectric oscillator, which is configured to include a piezoelectric vibrating piece 2, a case 3 in a nearly cylindrical shape with a bottom which accommodates the piezoelectric vibrating piece 2 therein and covers therearound, and a hermetic terminal 4 which hermetically seals an opening 3a of the case 3. In the embodiment, the piezoelectric vibrating piece 2 is a tuning fork vibrating piece, which is formed of a quartz crystal piece 2a in a nearly plate shape having a pair of oscillating arm portions 5 and 6 adjacently arranged in parallel with each other, and a base portion 7 fixing the base end side of the oscillating arm portions 5 and 6 in one piece. In addition, on each of two surfaces of the quartz crystal piece 2a, a conductive film such as chromium (Cr), nickel (Ni), aluminum (Al) or titanium (Ti) is formed in a predetermined pattern to provide a first excitation electrode 8, and a second excitation electrode 9. The first excitation electrode 8 and the second excitation electrode 9 are electrically isolated to each other and patterned.

Then, voltage is applied to each of the first excitation electrode 8 and the second excitation electrode 9 to oscillate them at a predetermined resonance frequency in the direction of bringing the oscillating arm portions 5 and 6 closer to each other or separating them from each other. In addition, on the tip end side of the oscillating arm portions 5 and 6, at least one of the first excitation electrode 8 and the second excitation electrode 9 has a fine tuning part 10 and a coarse tuning part 11 formed of a chromium (Cr) film. Since the fine tuning part 10 and the coarse tuning part 11 have some cuts by applying a laser beam, whereby the oscillating arm portions 5 and 6 are set to a predetermined resonance frequency.

The hermetic terminal 4 is configured to include a ring 12 in a nearly cylindrical shape press fitted into the opening 3a of the case 3, a lead 13 inserted into the ring 12, a filler 14 filled between the ring 12 and the lead 13 inside the ring 12 for hermetically sealing the ring 12. The filler 14 is formed of a material having insulating properties. In the embodiment, the filler 14 is formed of a glass ring made of borosilicate glass having a through hole 14a. In other words, the filler 14 is inserted into the ring 12, and fired in the state in which the lead 13 is inserted into the through hole 14a, whereby the filler 14 insulates the ring 12 from the lead 13 as well as hermetically seals in the case 3.

The lead 13 is arranged to be coaxial with a center axis L3 of the case 3 and a center axis L12 of the ring 12, having an inner lead portion 15 extended from the ring 12 to the inner side of the case 3, and a first outer lead portion 16 extended from the ring 12 to the outer side of the case 3, and the lead 13 is formed of a bar-shaped member, described later. On the tip end side of the inner lead portion 15, a bump connecting portion 15a is formed, which is formed of a stair portion in a nearly flat surface. In a flattening step, described later, the bump connecting portion 15a is formed into the stair portion in which a part (one side) of the lead 13 is flattened to near the center axis L3 to have a nearly flat surface. Then, to the bump connecting portion (stair portion) 15a, the first excitation electrode 8 of the piezoelectric vibrating piece 2 is connected through the bump in the base portion 7, whereby the first excitation electrode 8 and the lead 13 are electrically connected to each other, and the piezoelectric vibrating piece 2 is supported by the inner lead portion 15 of the lead 13 in an open-sided shape.

The ring 12 is configured to have a press fitting portion 12a in a nearly cylindrical shape, and a reducing portion 12b extended from the press fitting portion 12a into the case 3. The outer diameter of the press fitting portion 12a is formed nearly equal to the inner diameter of the case 3, and the press fitting portion 12a is press fitted into the case 3. In addition, the reducing portion 12b is formed to have a diameter smaller than that of the press fitting portion 12a, and arranged to have a clearance 12d between it and the inner side surface of the case 3. On a part of the outer side surface 12c of the reducing portion 12b, two step portions 12e and 12f in a nearly flat surface are formed. The two step portions 12e and 12f are formed nearly symmetrically to the center axis L12 of the ring 12, and nearly in parallel with two surfaces on which the first excitation electrode 8 and the second excitation electrode 9 of the piezoelectric vibrating piece 2 are formed.

In addition, the ring 12 is formed of a conductive material. Preferably, this conductive material is a material having a thermal expansion coefficient almost similar to that of glass to form the filler 14. For example, an iron-nickel-cobalt alloy or an iron-nickel alloy is preferably used. Then, the step portion 12e on the bump connecting portion (stair portion) 15a side in the two step portions 12e and 12f of the ring 12 is wire bonded to the second excitation electrode 9 of the piezoelectric vibrating piece 2 with a wire 17, and they are electrically connected to each other. In addition, in the embodiment, two wires 17 are provided.

The case 3 is formed of a conductive material in a nearly cylindrical shape with a bottom, having the opening 3a on one end side and the bottom part 3b on the other end side. Into the opening 3a of the case 3, the ring 12 of the hermetic terminal 4 is press fitted, whereby the inside of the case 3 is hermetically sealed in the vacuum state.

In addition, the bottom part 3b of the case 3 is formed with a second outer lead portion (projecting portion) 18 in a projection projecting outside. In this configuration, the piezoelectric oscillator 1 according to the embodiment can conduct to the first excitation electrode 8 of the piezoelectric vibrating piece 2 from outside the case 3 through the lead 13 with the first outer lead portion 16 as well as to the second excitation electrode 9 of the piezoelectric vibrating piece 2 from outside through the case 3, the ring 12 and the wire 17 with the second outer lead portion 18. In other words, the second outer lead portion (projecting portion) 18 formed on the case 3 and the lead 13 are formed in a pair of terminals.

In addition, gold plating (not shown) is partially applied to the portion in which the wire 17 is joined to the step portion 12e of the ring 12 of the hermetic terminal 4 and the bump connecting portion 15a of the inner lead portion 15, which allows excellent conductivity. This gold plating is deposited in a film thickness of about a few thousand angstroms in the step portion 12e and the bump connecting portion 15a.

Next, a method of fabricating the piezoelectric oscillator 1 will be described.

Figure 4:
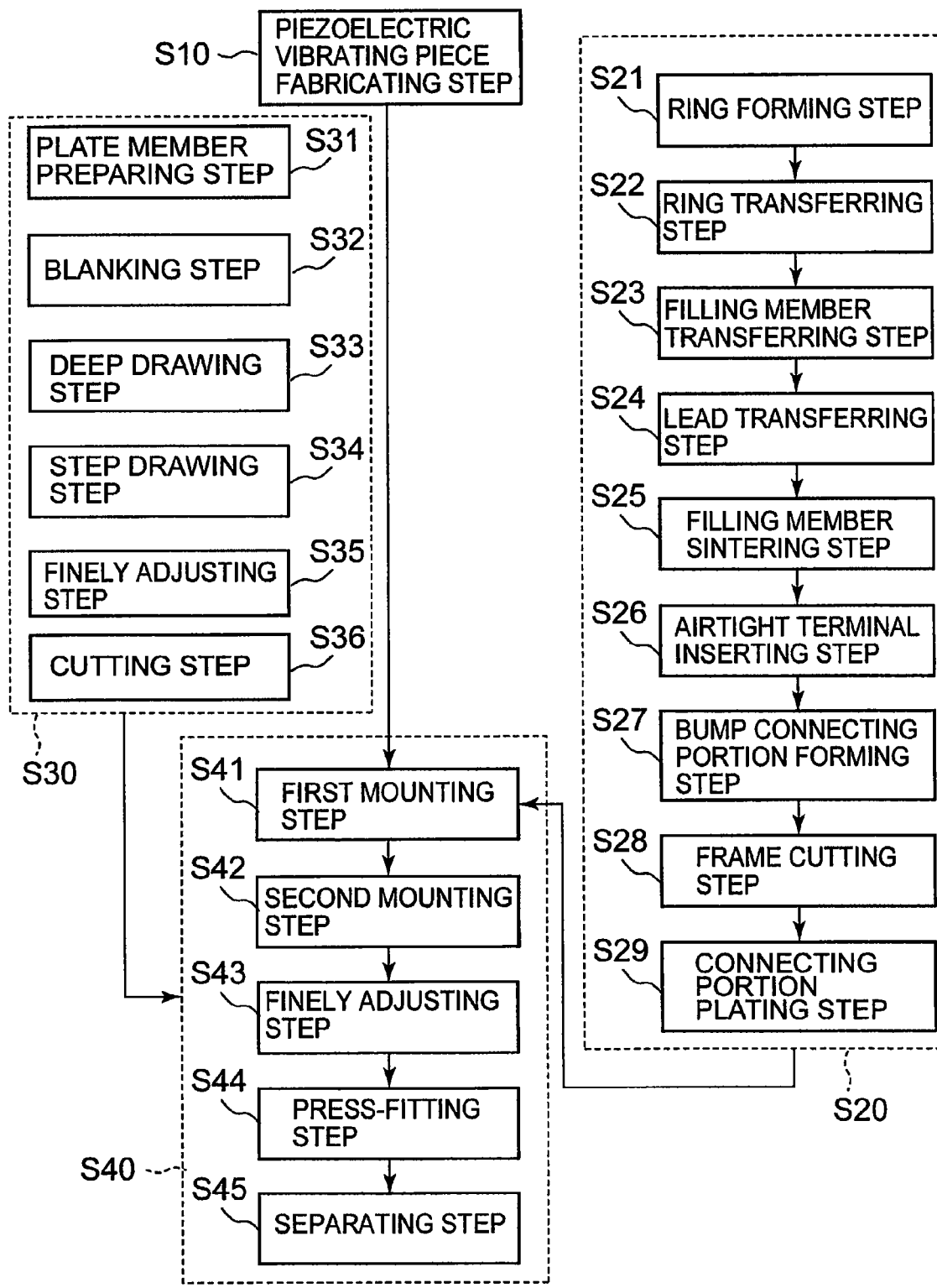
FIG. 4 shows a flow chart depicting the fabrication process steps of the piezoelectric oscillator according to the first embodiment of the invention.

FIG. 4 shows a flow chart depicting the fabrication process steps of the piezoelectric oscillator 1 according to the embodiment, and FIGS. 5 to 26 each show an illustration depicting the individual fabrication process steps. The fabrication process steps of the piezoelectric oscillator 1 according to the embodiment are roughly divided into a piezoelectric vibrating piece producing process step S10 in which the piezoelectric vibrating piece is produced, a hermetic terminal fabricating process step S20 in which the hermetic terminal 4 is fabricated, a case fabricating process step S30 in which the case 3 is fabricated, and an assembly process step S40 in which the piezoelectric vibrating piece 2, the hermetic terminal 4, and the case 3 are assembled. Hereinafter, the individual steps will be described in detail.

Figure 5:
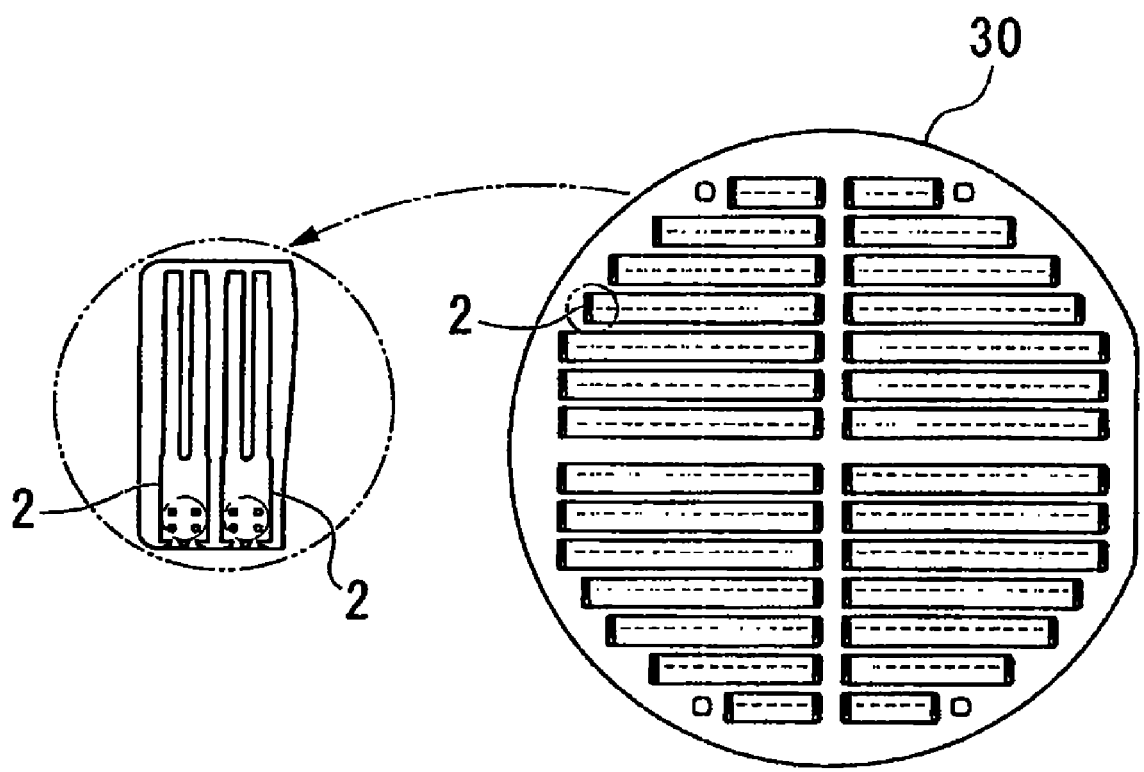
FIG. 5 shows an illustration depicting a piezoelectric oscillator producing process step in the fabrication process steps of the piezoelectric oscillator according to the first embodiment of the invention.

In the piezoelectric vibrating piece producing process step S10, first, a Lumbered rough stone quartz crystal is sliced to prepare a wafer having a predetermined thickness, and the wafer is polished to a certain thickness. Then, the outer shape of the quartz crystal piece 2a is patterned and etched on the wafer by photolithography, whereby a plurality of the quartz crystal pieces 2a can be prepared from the wafer. Subsequently, on each of the prepared quartz crystal pieces 2a, metal films are deposited for the first excitation electrode 8, the second excitation electrode 9, the fine tuning part 10, and the coarse tuning part 11. Then, for each of the quartz crystal pieces 2a, a laser beam is applied to the coarse tuning part 11 to partially evaporate the metal film forming the coarse tuning part 11 to change the weight, whereby the resonance frequency of the quartz crystal piece 2a is coarsely tuned, and then the piezoelectric vibrating piece 2 is completed. In addition, fine tuning in which the resonance frequency of the quartz crystal piece 2a is tuned more highly accurately is performed after assembled with the hermetic terminal 4. Then, as shown in FIG. 5, a plurality of the piezoelectric vibrating pieces 2 thus prepared is arranged on a dedicated palette 30, and carried to the assembly process step S40, described later.

Figure 6A:
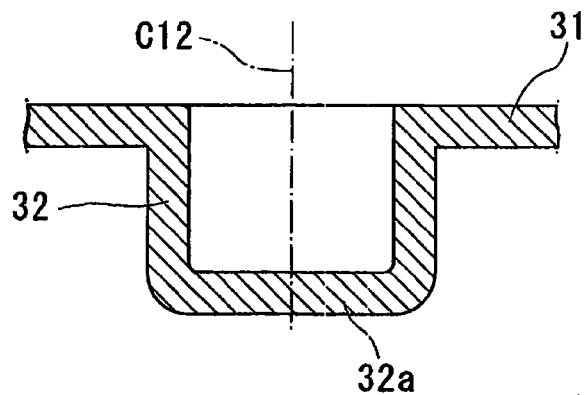
FIGS. 6A to 6D each show an illustration depicting a ring forming step in the fabrication process steps of the piezoelectric oscillator according to the first embodiment of the invention

Next, the hermetic terminal fabricating process step S20 will be described. In the hermetic terminal fabricating process step S20, first, the ring 12 is prepared as a ring forming step S21. In other words, as shown in FIG. 6A, a lance process is applied to a conductive plate member 31 such as an iron-nickel-cobalt alloy or an iron-nickel alloy for forming the ring 12, and then deep drawing is applied a plurality of times, whereby a cylinder member 32 is formed which has a bottom having the diameter nearly equal to the outer diameter of the press fitting portion 12a of the ring 12. In addition, the work position at which the cylinder member 32 is formed is accurately positioned by a pilot hole, not shown, formed in advance on the plate member 31, whereby a plurality of the cylinder members 32 can be arranged and formed.

Figure 6B:
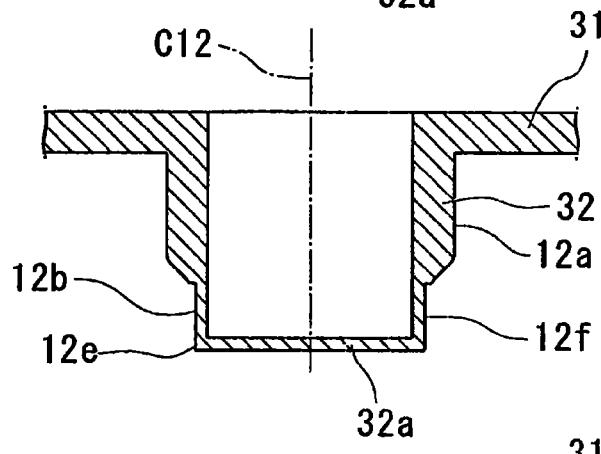
Figure 6C:
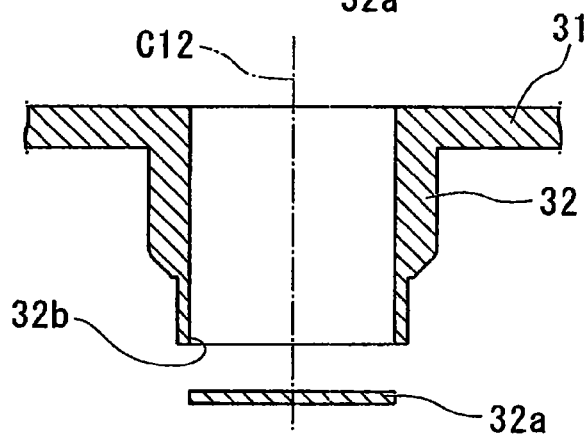
Figure 6D:
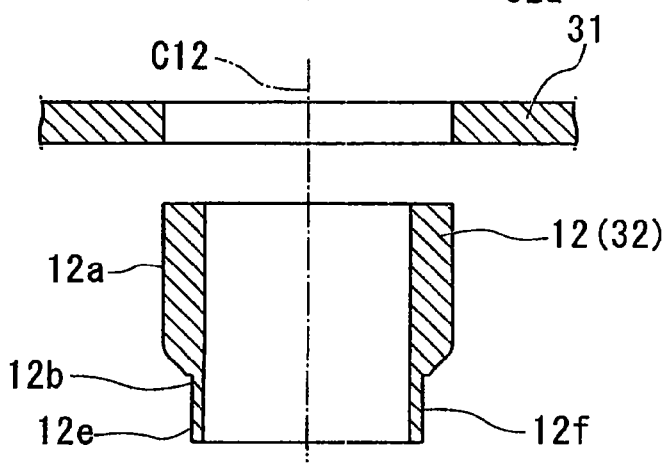

Subsequently, as shown in FIG. 6B, sizing is performed to form the reducing portion 12b and the two step portions 12e and 12f. In other words, the cylinder member 32 is molded in such a way that the portion to be the reducing portion 12b is further compressed to reduce the outer diameter thereof, and the portions to be the two step portions 12e and 12f are flat. Here, the two step portions 12e and 12f are formed nearly symmetrically to the center axis L12, whereby the reducing portion 12b can be formed in a uniform and nearly cylindrical shape without deforming the overall form. Then, as shown in FIG. 6C, a bottom part 32a of each of the cylinder members 32 is punched to form a ceiling hole 32b. Lastly, as shown in FIG. 6D, blanking is performed to remove the cylinder member 32 from the plate member 31 for completing the ring 12.

Figure 7:
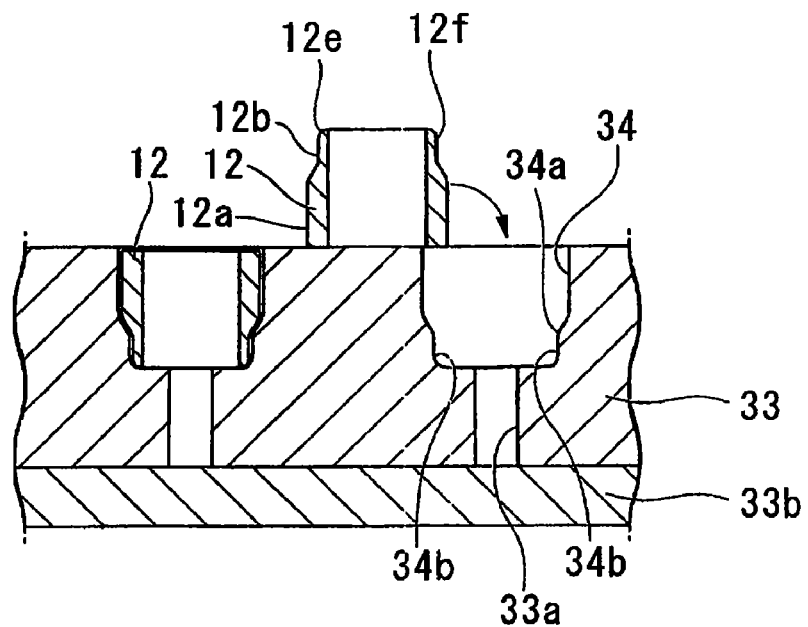
FIG. 7 shows an illustration depicting a ring loading step in the fabrication process steps of the piezoelectric oscillator according to the first embodiment of the invention.

Subsequently, the ring 12, the lead 13, and the filling member 14 are assembled. In other words, first, as a ring loading step S22, as shown in FIG. 7, a plurality of the rings 12 is mounted on a ring carbon jig 33 having a plurality of recessed parts 34. More specifically, the ring carbon jig 33 is formed of carbon so that it can be used in firing the filling member 14 in a filling member firing step S25, described later. In addition, on the bottom side of the recessed part 34, the recessed part 34 has a reducing portion 34a corresponding to the reducing portion 12b of the ring 12 and a flat portion 34b corresponding to the two step portions 12e and 12f of the ring 12 so that the ring 12 can be inserted downward. The orientation of each of the flat portions 34b of the plurality of the recessed parts 34 is formed to be nearly equal to each other. In addition, on the bottom surface of the recessed part 34, an insertion hole 33a is formed into which the lead 13 can be inserted coaxially to the recessed part 34. The depth of the insertion hole 33a is matched with the length of the inner lead portion 15 of the lead 13, and the insertion hole 33a is blocked with a bottom plate 33b.

Then, the plurality of the rings 12 is placed on the top of the ring carbon jig 33, and vibrations are applied to the ring carbon jig 33 to load the plurality of the rings 12 as the orientation thereof is aligned to the recessed part 34 nearly equally. At this time, since the ring 12 is formed as the two step portions 12e and 12f are nearly symmetrically to the center axis L12 and the ring 12 is formed in a nearly symmetric member overall, the ring 12 can be more smoothly loaded by vibrations.

Figure 8:
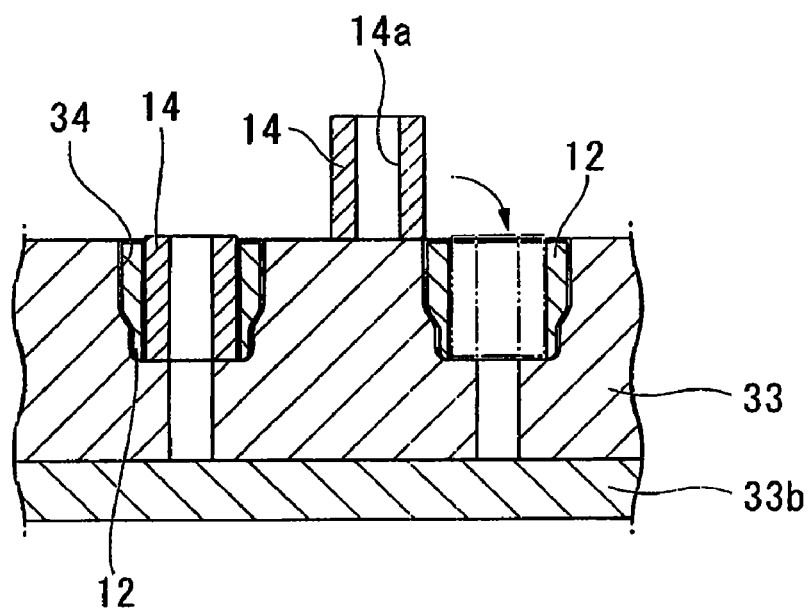
FIG. 8 shows an illustration depicting a filling member inserting step in the fabrication process steps of the piezoelectric oscillator according to the first embodiment of the invention.

Subsequently, as shown in FIG. 8, as a filling member inserting step S23, the filling member 14 is inserted into each of the rings 12 loaded in the recessed part 34 of the ring carbon jig 33. Since the filling member 14 has a shape before fired in the filling member firing step S25, described later, the filling member 14 has the outer diameter that the filling member 14 can be inserted into the ring 12 as well as a shape having the through hole 14a into which the lead 13 can be inserted. Then, a plurality of the filling members 14 is placed on the top of the ring carbon jig 33 to vibrate the ring carbon jig 33, whereby each of the filling members 14 is inserted into the ring 12.

Figure 9:
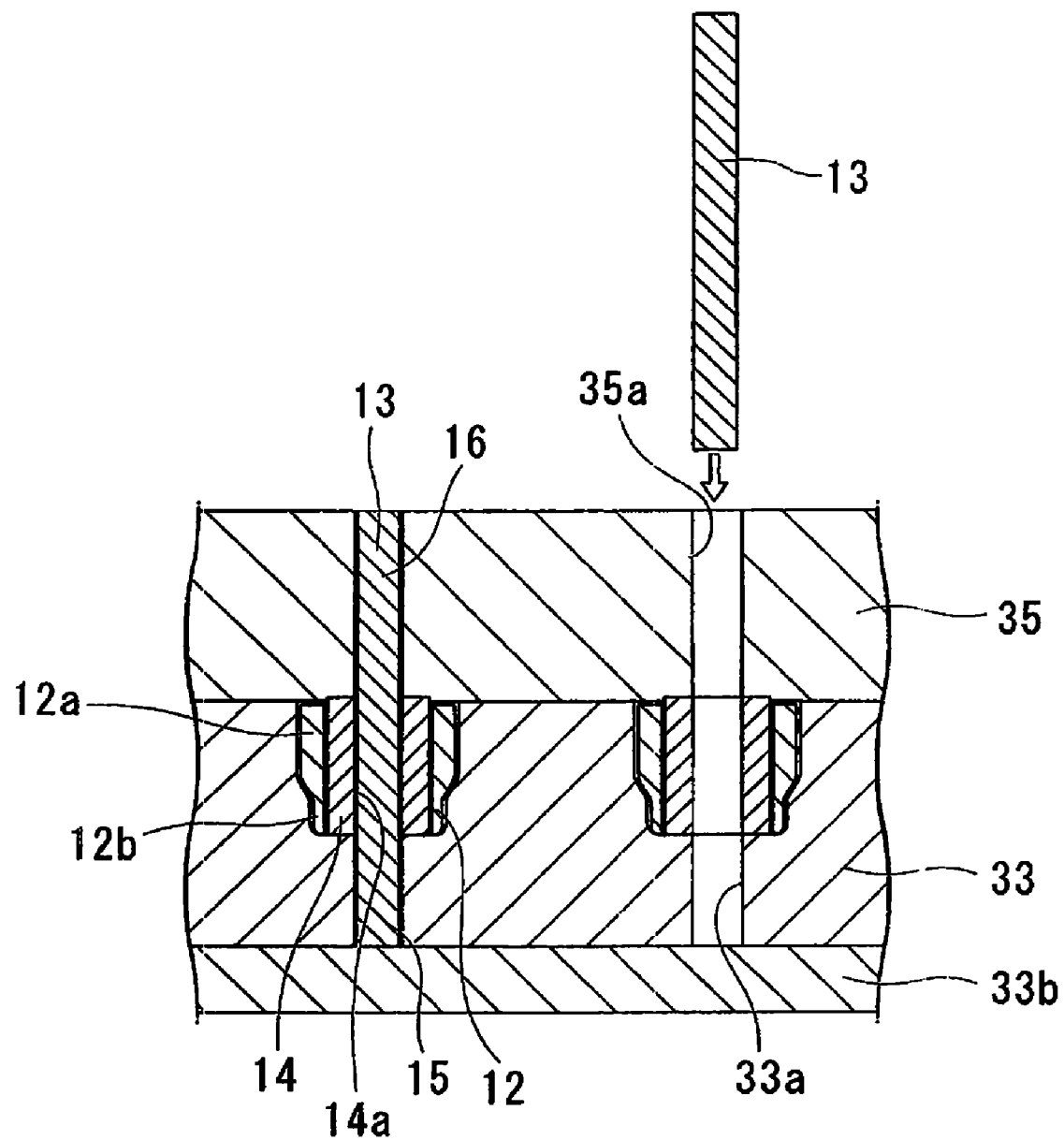
FIG. 9 shows an illustration depicting a lead inserting step in the fabrication process steps of the piezoelectric oscillator according to the first embodiment of the invention.
Figure 10:
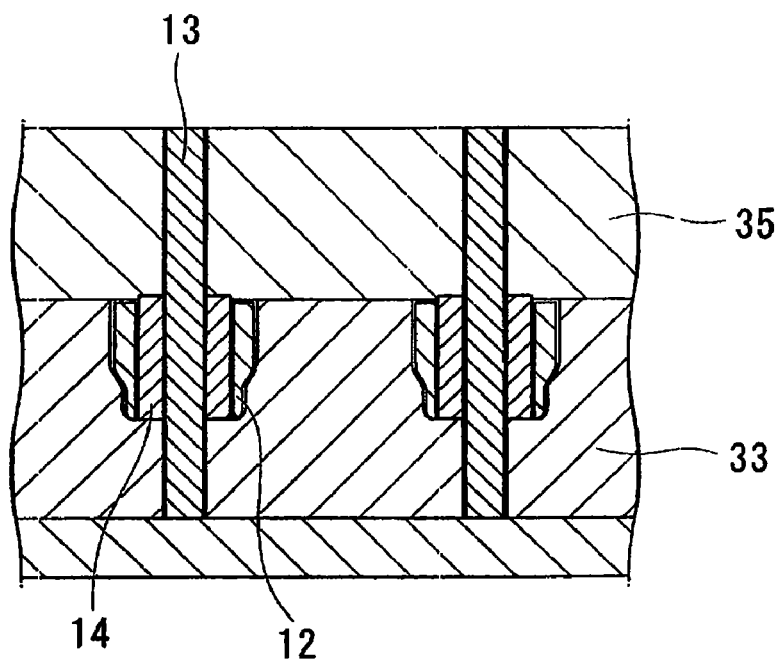
FIG. 10 shows an illustration depicting a filling member firing step in the fabrication process steps of the piezoelectric oscillator according to the first embodiment of the invention.

Subsequently, as shown in FIG. 9, as a lead inserting step S24, the lead 13 is inserted into the through hole 14a of the filling member 14 that is inserted into the ring 12. First, a lead carbon jig 35 is placed on the top of the ring carbon jig 33 in which the ring 12 and the filling member 14 are loaded. The lead carbon jig 35 is formed with a plurality of through holes 35a into which the lead 13 can be inserted. In addition, the ring carbon jig 33 and the lead carbon jig 35 have a positioning pin and a corresponding positioning hole, not shown, and the recessed part 34 and the through hole 35a are arranged coaxially to each other in the state in which the jigs 33 and 35 are joined to each other. Then, a plurality of the leads 13 is placed on the top of the lead carbon jig 35, and vibrations are applied to the ring carbon jig 33 and the lead carbon jig 35. Then, each of the leads 13 is inserted into the through hole 14a of the filling member 14 inserted into the ring 12, and the ring 12 and the filling member 14 are joined to each other in the state in which the inner lead portion 15 is extended under the ring 12, and the first outer lead portion 16 is extended above the ring 12.

Figure 11:
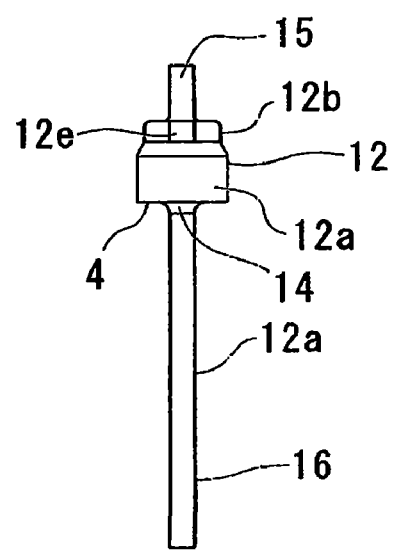
FIG. 11 shows a schematic diagram depicting a hermetic terminal prepared in a hermetic terminal fabricating process step in the fabrication process steps of the piezoelectric oscillator according to the first embodiment of the invention.

Subsequently, as a filling member firing step S25, the filling member 14 is fired as it is joined to the ring 12 and the lead 13. In other words, as shown in FIG. 11, the ring carbon jig 33 and the lead carbon jig 35 are arranged in the heating furnace as the ring 12, the lead 13 and the filling member 14 are inserted therein, and they are fired at a predetermined temperature. Thus, the filling member 14 is fired to hermetically seal the ring 12 to the lead 13, and then the ring 12, the lead 13 and the filling member 14 are formed in one piece. As shown in FIG. 11, the hermetic terminal 4 is formed. In addition, the bump connecting portion 15a of the inner lead portion 15 of the lead 13 is formed in a bump connecting portion forming step S27, described later.

Figure 12A:
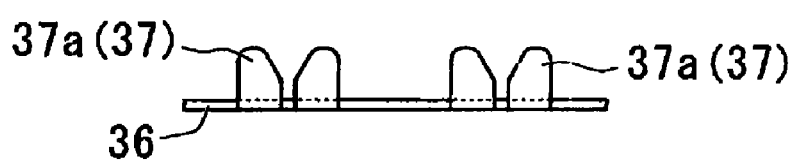
FIGS. 12A and 12B each show a schematic diagram depicting a unit frame in the fabrication process steps of the piezoelectric oscillator according to the first embodiment of the invention.
Figure 12B:
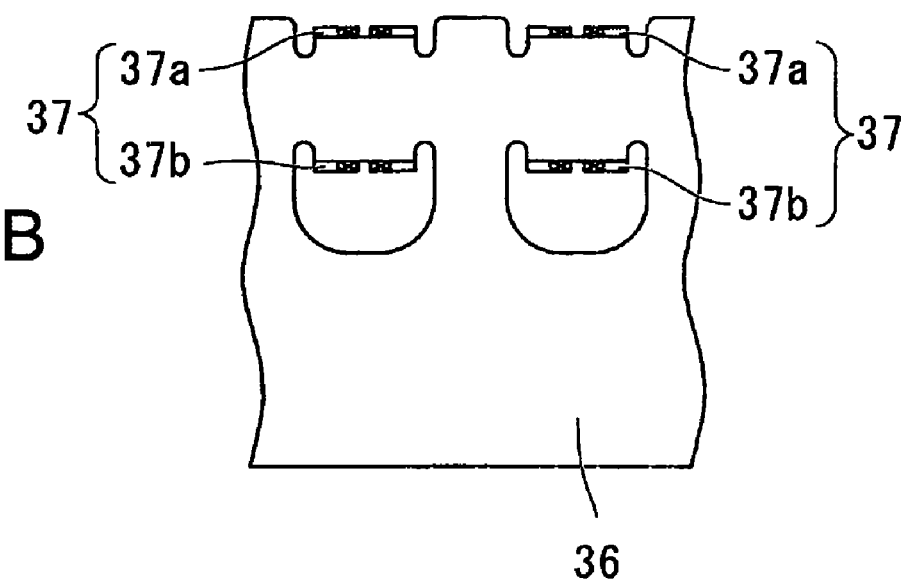
Figures 13A, 13B:
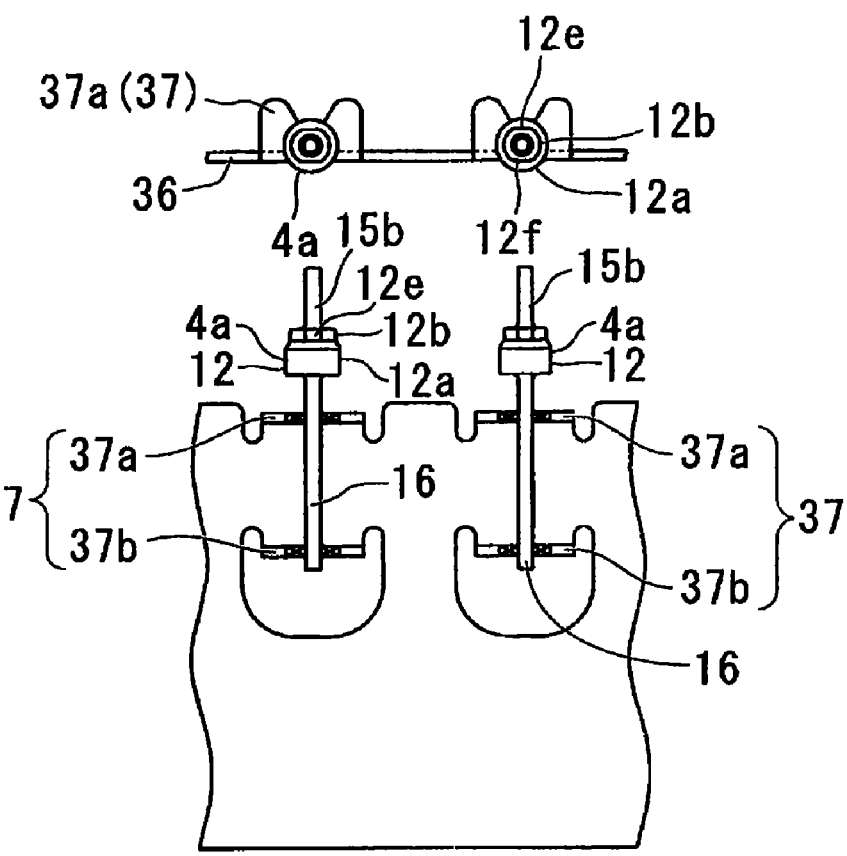
FIGS. 13A and 13B each show an illustration depicting a hermetic terminal inserting step in the fabrication process steps of the piezoelectric oscillator according to the first embodiment of the invention.

Subsequently, as a hermetic terminal inserting step S26, the hermetic terminal 4 is removed from the ring carbon jig 33 and the lead carbon jig 35, and arranged on a unit frame 36. FIGS. 12A and 12B show the unit frame 36 before the hermetic terminal 4 is arranged, and FIGS. 13A and 13B show the unit frame 36 after the hermetic terminal 4 is arranged. Not shown in FIGS. 12A and 12B, the unit frame 36 is a member continued in a belt shape, and has a plurality of hermetic terminal arranging parts 37 at equal intervals in the longitudinal direction. The hermetic terminal arranging part 37 is configured of a pair of fitting portions 37a and 37b into which the first outer lead portion 16 of the lead 13 can be fitted in each of the hermetic terminals 4. Then, as shown in FIGS. 13A and 13B, each of the hermetic terminals 4 is arranged on each of the hermetic terminal arranging parts 37 of the unit frame 36 in such a way that the first outer lead portion 16 is fitted into the pair of the fitting portions 37a and 37b as any one of the two step portions 12e and 12f of the ring 12 is directed upward. Here, in the hermetic terminal 4, the two step portions 12e and 12f of the ring 12 are formed nearly symmetrically to each other to the center axis of L12. Thus, even though any one of the two step portions 12e and 12f is selected and placed as it is directed upward, wire bonding can be performed under the same conditions in a second mounting step S32, described later. In other words, the since a plurality of the step portions is provided, in arranging the hermetic terminals 4, any one of the step portions to be the position for wire bonding later can be readily adjusted upward.

Figure 14A:
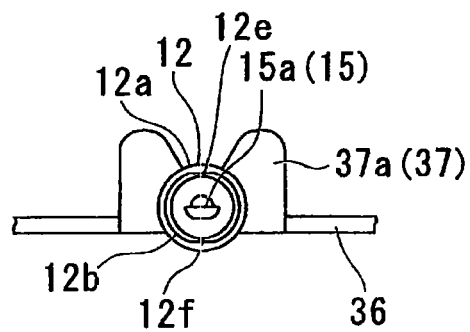
FIGS. 14A and 14B each show an illustration depicting a bump connecting portion forming step in the fabrication process steps of the piezoelectric oscillator according to the first embodiment of the invention.
Figure 14B:
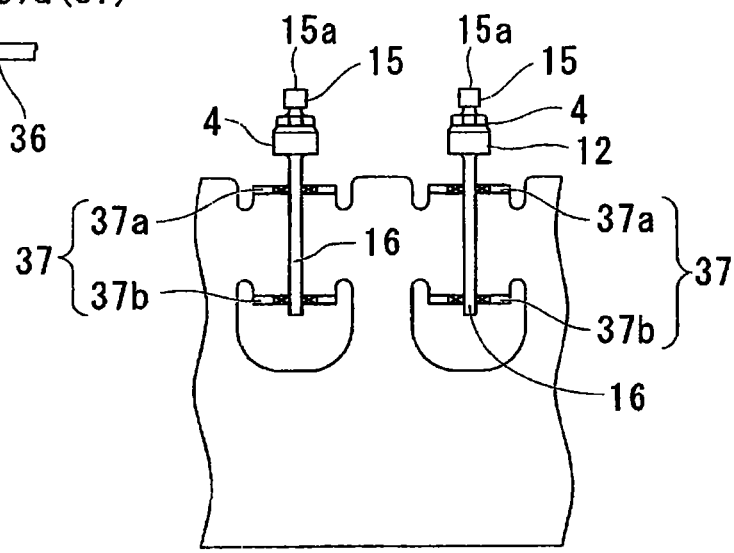

Subsequently, as the bump connecting portion forming step S27, the bump connecting portion 15a is formed on the inner lead portion 15 of each of the hermetic terminals 4. In other words, as shown in FIGS. 14A and 14B, while the unit frame 36 is being moved, the tip end portion of the inner lead portion 15 of each of the hermetic terminals 4 extended from the unit frame 36 is in turn flattened. Here, the bump connecting portion forming step S27 is performed after the filling member firing step S25 as in the embodiment, whereby it is unnecessary to adjust the relative orientations of the two step portions 12e and 12f of the ring 12 and the lead 13 to the bump connecting portion 15a in the lead inserting step S24 and the filling member firing step S25. In addition, in forming the bump connecting portion 15a in the bump connecting portion forming step S27, since the lead 13 is formed in one piece with the ring 12, the relative orientation to the two step portions 12e and 12f of the ring 12 can be readily, highly accurately adjusted to form the bump connecting portion 15a.

Figure 15:
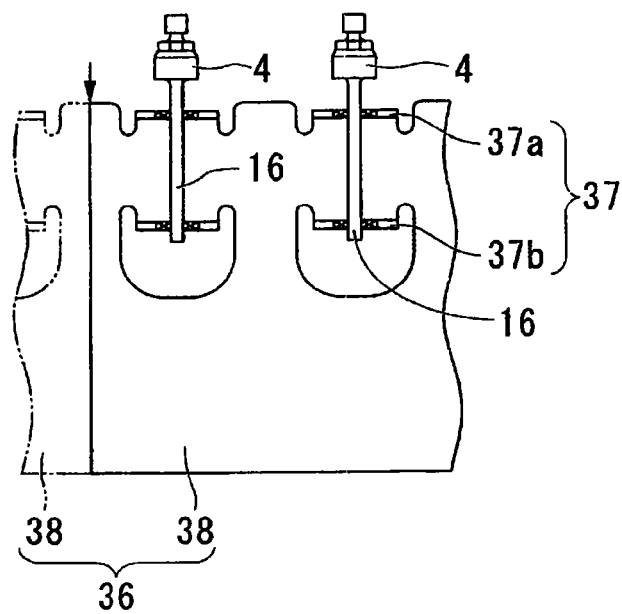
FIG. 15 shows an illustration depicting a frame cutting step in the fabrication process steps of the piezoelectric oscillator according to the first embodiment of the invention.

Subsequently, as a frame cutting step S28, as shown in FIG. 15, the unit frame 36 in a belt shape is cut in every predetermined length. Hereinafter, the unit frame after cut is referred to as a palette 38.

Figure 16:
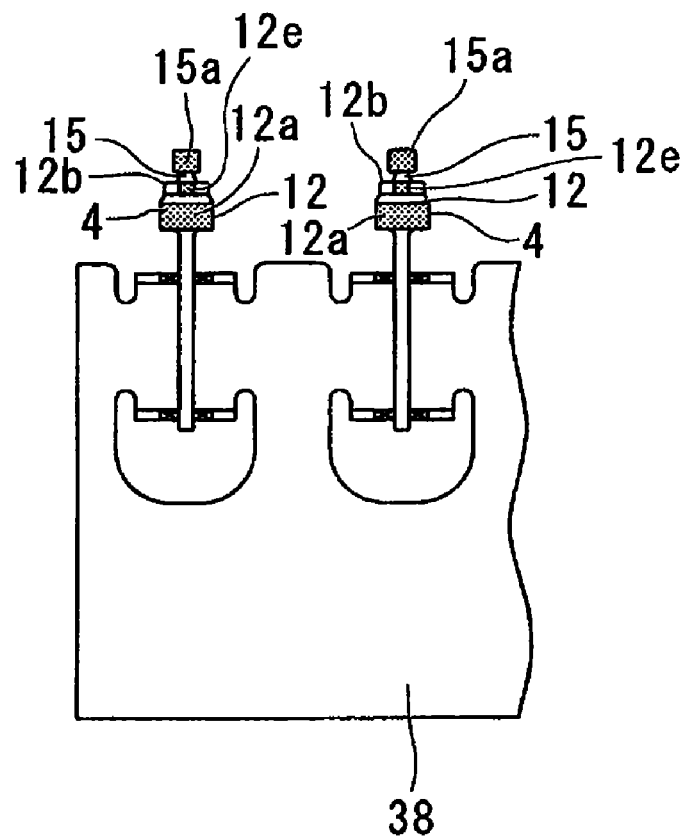
FIG. 16 shows an illustration depicting a plating step in the fabrication process steps of the piezoelectric oscillator according to the first embodiment of the invention.

Subsequently, as a connecting portion plating step S29, as shown in FIG. 16, for every palette 38, gold plating is applied to the outer side surface of the press fitting portion 12a and a part of the step portion 12e of the ring 12 and the bump connecting portion 15a of the lead 13 in each of the hermetic terminals 4.

As plating, base plating and finish plating are applied. As base plating, for example, copper plating is applied. As finish plating for the outer side surface of the press fitting portion 12a of the ring 12, for example, a tin-copper alloy is plated in a film thickness of about a few µm to a few tens µm for hermetically holding the press fitting to the case 3. As finish plating for the step portion 12e and the bump connecting portion 15a, gold plating is applied.

Gold plating in the step portion 12e is applied for wire bonding, described later, and gold plating in the bump connecting portion 15a of the lead 13 is applied for bump connection to the first excitation electrode 8 of the piezoelectric vibrating piece 2, described later. As gold plating for the step portion 12e and the bump connecting portion 15a, for example, it is applied in a film thickness of about a few thousand angstroms.

In addition, tin-copper alloy plating is applied to the step portion 12e and the bump connecting portion 15a, and then gold plating may be further applied thereon. In addition, gold plating may be further applied to the surface of tin-copper alloy plating on the press fitting portion 12a of the ring 12.

Therefore, all the steps of the hermetic terminal fabricating process step S20 are completed.

Next, the case fabricating process step S30 will be described. The case fabricating process step S30 is an embodiment of the method of fabricating a case according to the invention. First, as a plate member preparing step S31, the plate member is prepared which is formed of a conductive material to be a material for the case 3. As the plate member, particularly, nickel silver with nickel plating (C7521-R-O) is preferable. Thus, in the embodiment, nickel silver with nickel plating is used. For the plate member, first, a nickel silver (C7521-R-O) plate in a belt shape having a width of 15 µm is prepared, and then nickel plating is applied to both surfaces to form a plating film having a thickness of about 1.2 µm to 1.4 µm on both surfaces. Then, a plating film is formed on both surfaces in this manner to produce a plate member (hoop member) having a thickness of 0.12 µm. In addition, plating is thus applied, and then the plate is wound and cut along the length direction to adjust the width to 6 mm. In this manner, the plate member prepared for the following process is obtained.

Figure 17:
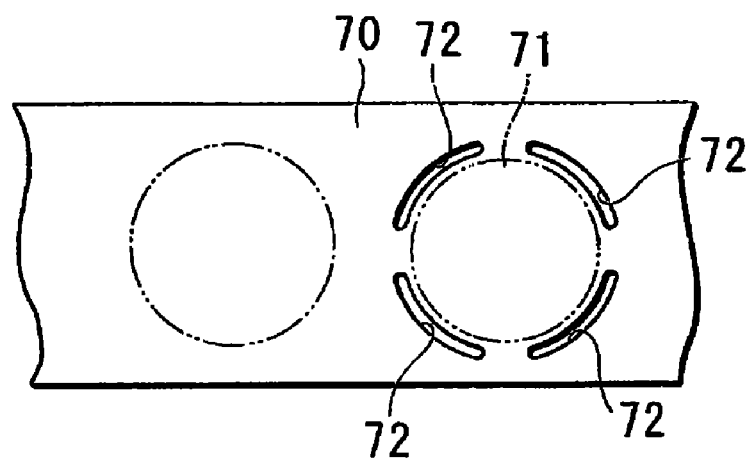
FIG. 17 shows an illustration depicting a blanking step in the fabrication process steps of the piezoelectric oscillator according to the first embodiment of the invention.

The plate member in a belt shape is prepared, and then as a blanking step S32, as shown in FIG. 17, to this plate member 70, a die and a punch, not shown, are used to open a through hole 72 in an arc shape at a plurality of places (four places in the embodiment) outside a work area 71 in a circular shape along the direction of the outer edge of the work area 71. The through holes 72 are formed in this manner, and the work area 71 is partially separated from the non-work area on the plate member 70, whereby the subsequent deep drawing step can be performed smoothly.

Subsequently, as a deep drawing step S33, the work area 71 on the plate member 70 is deep drawn and the plate member 70 is shaped into a cylindrical shape with a bottom. In the embodiment, as shown in FIG. 18A to 18D, deep drawing is performed in four stages, and the plate member 70 is deep drawn step by step, whereby the plate member 70 is shaped into a cylindrical shape with a bottom. In addition, in the deep drawing in four stages, the tools with different dimensions are used in each process to increase the degree of deep drawing step by step. In addition, in FIGS. 18A to 18D, the states of deep drawing are shown on the left side (left drawings), and the shapes of the plate member 70 deep drawn are shown on the right side (right drawings).

As shown in the left drawings in FIGS. 18A to 18D, in the deep drawing step S33, a die 73 with a recessed part or hole and a punch 74 in a round bar shape are used as tool. The die 73 and the punch 74 are combined into a module, the die 73 and the punch 74 with different dimensions are used in each of the processes shown in FIGS. 18A to 18D, that is, in the first deep drawing process in FIG. 18A, the second deep drawing process in FIG. 18B, the third deep drawing process in FIG. 18C, and the fourth deep drawing process in FIG. 18D.

As the dies 73, in the embodiment, ones having a recessed part 75 with a circular opening shape are used, and these dies 73 have the inner diameter of the recessed part 75 smaller step by step from FIGS. 18A to 18D. In addition, particularly, in the die 73 used in the third deep drawing process in FIG. 18C, the bottom surface of the recessed part 75 is formed in the concave surface, and in the die 73 used in the fourth deep drawing process in FIG. 18D, the center part of the bottom surface of the recessed part 75 is formed in the concave surface deeper than that in FIG. 18C.

On the other hand, the punch 74 has a cylindrical shape, and the outer diameter thereof is smaller than the inner diameter of the recessed part 75 of the corresponding die 73 by the amount almost equivalent to the thickness of the plate member 70. In addition, in these punches 74, the edge of the lower end surface is rounded to prevent the edge from damaging the plate member 70. In addition, particularly, in the punch 74 used in the third deep drawing process in FIG. 18C and the punch 74 used in the fourth deep drawing process in FIG. 18D, the lower end surface thereof is formed in a convex surface as it corresponds to the bottom surface shape of the recessed part 75 of the corresponding die 73.

For deep drawing with the use of the dies 73 and the punches 74, first, the plate member 70 in a belt shape after the blanking step S32 is placed on the die 73, and the work area 71 is positioned to the recessed part 75 of the die 73. Subsequently, as shown in the left drawing in FIG. 18A, the punch 74 is descended from above the plate member 70, and press fitted into the recessed part 75. Thus, the work area 71 in the plate member 70 is subjected to the first deep drawing process, and as shown in the right drawing in FIG. 18A, a cylindrical shape with a bottom is formed with a relatively larger outer diameter and relatively shallower depth. Then the punch 74 is ascended to draw the plate member 70 upward together. After that, the plate member 70 is removed and transferred from the punch 74 for the subsequent tool.

Figure 18A:
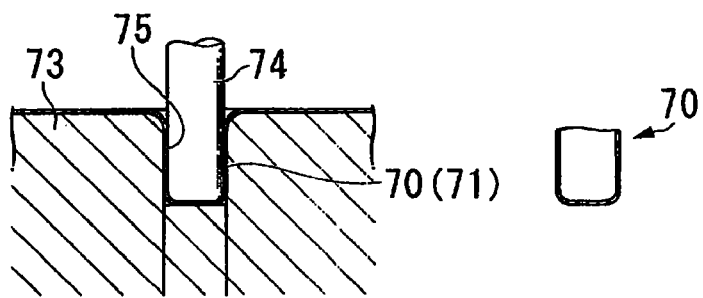
FIGS. 18A to 18D each show an illustration depicting a deep drawing step in the fabrication process steps of the piezoelectric oscillator according to the first embodiment of the invention.
Figure 18B:
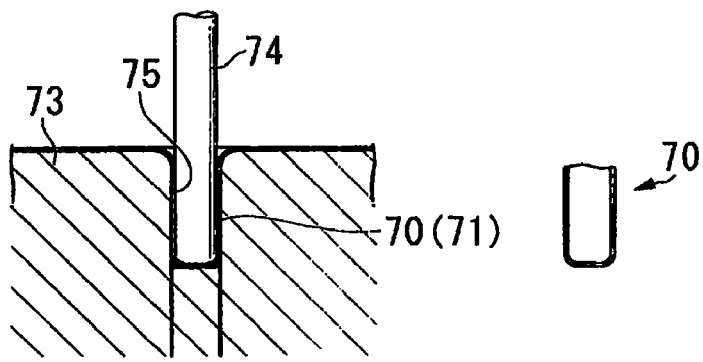

In other words, the work area 71 is placed on the subsequent die 73, and the second deep drawing process is performed as shown in FIG. 18B as similar to the first deep drawing process. The third deep drawing process shown in FIG. 18C and the fourth deep drawing process shown in FIG. 18D are in turn performed. In addition, since the plate member 70 is continued long in a belt shape, the first deep drawing process shown in FIG. 18A is applied to the work area 71 next to the work area 71 under the second deep drawing process shown in FIG. 18B. In addition, as the work area 71 goes to the third deep drawing process and then the fourth deep drawing process, the subsequent work areas 71 also in turn goes to the processes. Here, each of the work areas 71 is accurately positioned by pilot holes, not shown, formed in advance in the plate member 70, whereby a plurality of the work areas 71 is in turn transferred for continuous deep drawing.

Figure 18C:
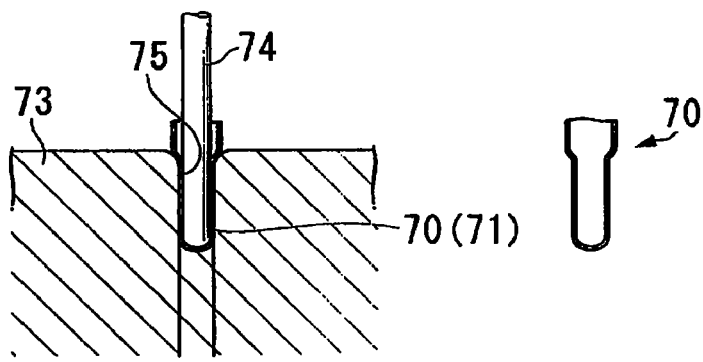
Figure 18D:
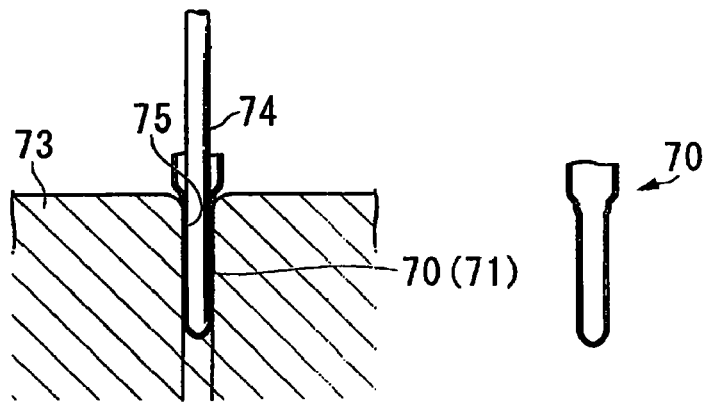

In addition, particularly, after the third deep drawing process shown in FIG. 18C, as shown in FIG. 18C, the right drawings in the plate member 70 has the bottom part spherically swelled outward. After the fourth deep drawing process shown in FIG. 18D, as shown in FIG. 18D, the plate member 70 in the right drawing has the center part of the bottom part projecting toward the outer surface. In addition, in the third deep drawing process and the fourth deep drawing process, the work area 71 formed in a cylindrical shape with a bottom does not come into the recessed part 75 of the die 73 entirely, and it is processed as the opening side is floated above the die 73.

The deep drawing step S33 including the first to fourth deep drawing processes is performed in this manner, as shown in the right drawing in FIG. 18D, the plate member 70 is formed in a cylindrical shape with a bottom, and then the plate member 70 is transferred to a step drawing step S34.

Basically as similar to the deep drawing step S33, in the step drawing step S34, tools formed of a die 76 and a punch 77 corresponding thereto are used to advance drawing step by step. In other words, in the step drawing step S34, in the embodiment, as shown in FIGS. 19A to 19D, step drawing in fourth stages is performed to step draw the plate member 70 step by step, whereby the projecting portion to be the second outer lead portion 18 is formed on the outer surface of the bottom part of the plate member already formed in a cylindrical shape with a bottom.

Also in the step drawing in fourth stages, the tools with different dimensions are used in each of the processes to increase the degree of step drawing step by step. In addition, in FIGS. 19A to 19D, and FIGS. 20A and 20B, described later, the states of step drawing are shown on the left side (left drawings), the shapes of the plate member 70 formed in the step drawing are shown in the center part (center drawings), and the bottom part shapes of the plate member 70 formed by step drawing are enlarged and shown on the right side (right drawings).

As shown in the left drawings in FIGS. 19A to 19D, in the step drawing step S34, a die 76 with a recessed part or hole and a punch 77 in a bar shape are used as tools. The die 73 and the punch 74 are combined into a module, and the die 76 and the punch 77 with different dimensions are used in each of the processes shown in FIGS. 19A to 19D, that is, in the first step drawing process shown in FIG. 19A, the second step drawing process shown in FIG. 19B, the third step drawing process shown in FIG. 19C, and the fourth step drawing process shown in FIG. 19D.

As the die 76, in the embodiment, an upper die 78 having a through hole 78a with a circular opening, and a lower die 79 having a hole 79a with a circular opening are used. In the upper die 78 and the lower die 79, the through hole 78a and the hole 79a communicate with each other, and are joined for use as the center axes of the through hole 78a and the hole 79a are matched with each other. Here, the hole 79a of the lower die 79 is formed to have different diameters on the top side and lower side of the lower die 79 in particular. In the embodiment, since the portion directly used for step drawing is only the portion on the top side of the lower die 79, the hole 79a indicates the hole on the top side of the lower die 79. In the lower die 79 in this configuration, the inner diameter of the hole 79a (the hole on the top side of the lower die 79) becomes smaller step by step from FIG. 19A to 19D. On the other hand, in the upper die 78, the diameter of the through hole 78a is the same in FIG. 19A to 19D.

In addition, in the lower die 79 used in each of the step drawing processes in FIG. 19A to 19D, the opening of the top side of the lower die 79 in the hole 79a is reduced in the diameter from the open side to the lower side, and then it is formed in a constant inner diameter. Here, in the invention, the portion formed in the constant inner diameter is referred to "the recessed part or hole having the inner diameter smaller than the outer diameter of the bottom part of the plate member formed in a nearly cylindrical shape with a bottom by the deep drawing step".

On the other hand, as similar to those used in deep drawing, the punches 77 corresponding to these dies 73 have a cylindrical shape, and the outer diameter thereof is smaller than the inner diameter of the through hole 78a of the corresponding upper die 78 by the amount equivalent to the thickness of the plate member 70. In addition, also in the punches 77, the edge of the lower end surface is rounded, whereby the edge is prevented from damaging the plate member 70. Then, in these punches 77, a projecting part is formed on the center part on the lower end surface as it corresponds to the shape of the opening of the corresponding lower die 79. In the projecting parts of the punches 77, the outer diameter or the height thereof becomes smaller from FIG. 19A to 19D.

Figure 19A:
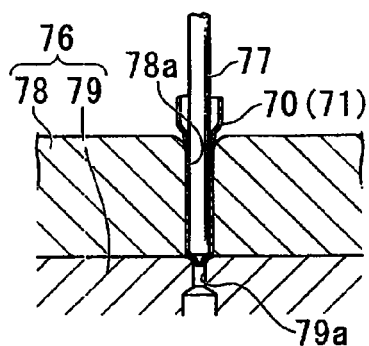
FIGS. 19A to 19D each show an illustration depicting a step drawing step in the fabrication process steps of the piezoelectric oscillator according to the first embodiment of the invention.
Figure 19A:
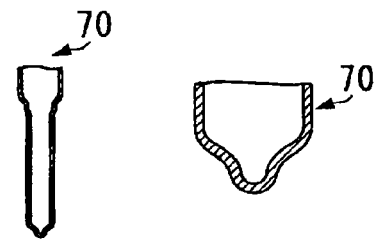

For step drawing with the use of the dies 76 and the punches 77, first, the plate member 70 in a cylindrical shape with a bottom after deep drawing described above is placed on the upper die 78 of the die 76 shown in the left drawing in FIG. 19A, and the bottom part side of the cylinder with a bottom is positioned to the through hole 78a of the upper die 78. Then, as shown in the left drawing in FIG. 19A, the punch 77 is descended from above the plate member 70, and press fitted into the through hole 78a. Thus, the cylindrical portion of the plate member 70 in a cylindrical shape with a bottom comes into the through hole 78a, and bottom part comes into the hole 79a of the lower die 79. In this manner, the punch 77 is press fit, the bottom part of the plate member 70 in a cylindrical shape with a bottom is abutted against inside the opening of the hole 79a of the lower die 79, that is, the surface including the opening of the portion formed in a constant inner diameter in the hole 79, and as shown in the right drawing in FIG. 19A, the bottom part of the plate member 70 is step drawn into the shape corresponding to the surface in the first step drawing.

Subsequently, the punch 77 is ascended to draw the plate member 70 together. After that, the plate member 70 is removed and transferred from the punch 77 for the subsequent tool.

Figure 19B:
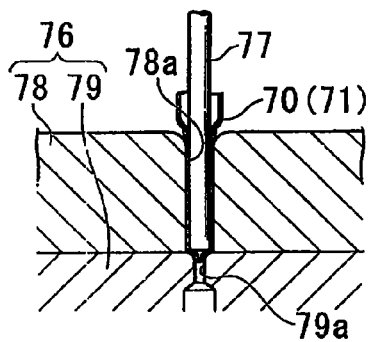
Figure 19B:
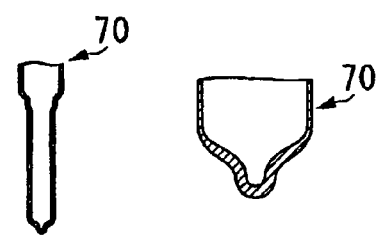
Figure 19C:
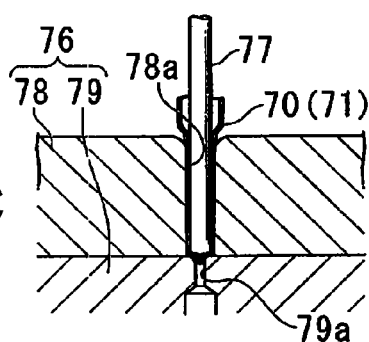
Figure 19C:
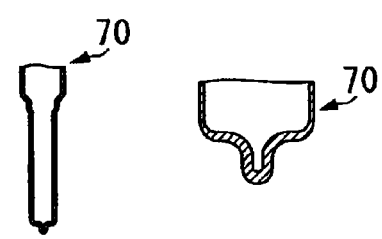
Figure 19D:
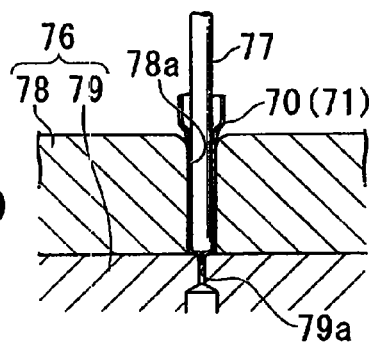
Figure 19D:
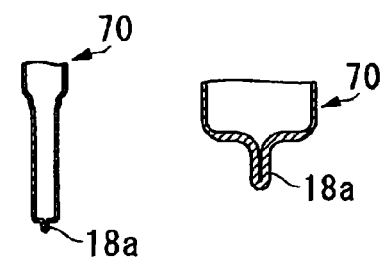

In other words, the plate member 70 in a cylindrical shape with a bottom is placed on the subsequent die 76 to perform the second step drawing process as shown in FIG. 19B as similar to the first step drawing process. The third step drawing process shown in FIG. 19C and the fourth step drawing process shown in FIG. 19D are in turn performed. In addition, sine the plate member 70 is continued long in a belt shape, the worked portions in a cylindrical shape with a bottom are in turn transferred to each of the tools for continuous step drawing process, which is the same as the case of the deep drawing step.

As described above, the step drawing step S34 of the first to fourth step drawing processes is performed, and then a projecting portion 18a is formed on the bottom part of the plate member 70 in a cylindrical shape with a bottom as shown in the right drawing in FIG. 19D. However, in the embodiment, the projecting portion 18a is formed longer than the second outer lead portion 18 shown in FIG. 1, and the outer diameter thereof is formed smaller (narrower). The projecting portion 18a longer than a desired length is formed, and then the plate member 70 in a cylindrical shape with a bottom goes to a subsequent adjusting step S35.

As similar to the step drawing step S34, the adjusting step S35, the tool formed of the die 76 and the punch 77 corresponding thereto is used for a sizing process. In other words, in the embodiment, in the adjusting step S35, as shown in FIG. 20, a tool formed of an upper die 78 having a through hole 78a with a circular opening and a lower die 79 having a hole 80 with a circular opening is used, in which the projecting portion 18a is compressed to adjust the projecting portion 18a to have a desired length. Here, the hole 80 has a desired depth corresponding to the length of the second outer lead portion 18 shown in FIG. 1, that is, a desired length, and has a predetermined inner diameter corresponding to the thickness of the second outer lead portion 18, that is, a desired outer diameter.

For this sizing process, first, the plate member 70 in a cylindrical shape with a bottom after step drawing described above is placed on the upper die 78 of the die 76, and the bottom part side of the cylindrical portion with a bottom is positioned to the through hole 78a of the upper die 78. Subsequently, as shown in the left drawing in FIG. 20, the punch 77 is descended from above the plate member 70, and press fitted into the through hole 78a. Thus, the cylindrical portion of the plate member 70 in a cylindrical shape with a bottom comes into the through hole 78a, and the projecting portion 18a of the bottom part further comes into the hole 80 of the lower die 79. In this manner, the punch 77 is press fitted for a predetermined time, and then the projecting portion 18a is press fitted into the hole 80, whereby the bottom part forming the projecting portion 18a is pressed as it is abutted against the top of the lower die 79 in the through hole 78a. Therefore, the tip end side of the projecting portion 18a is relatively pressed against the bottom surface of the hole 80 of the lower die 79, and the bottom part side of the plate member 70 is pressed by the punch 77, whereby the length is compressed to the length corresponding to the depth of the hole 80, and the plate member 70 is gathered to adjust the thickness (outer diameter) to the thickness (outer diameter) corresponding to the inner diameter of the hole 80. Thus, the length and thickness of (outer diameter) the projecting portion 18a are adjusted to the same as the second outer lead portion 18 shown in FIG. 1.

The projecting portion 18a is adjusted in this manner, and then the plate member 70 in a nearly cylindrical shape with a bottom with the projecting portion goes to a cutting step S36 in which the plate member 70 is cut at a predetermined position on the opening side.

As similar to the deep drawing step S33, in the cutting step S36, a tool formed of a die 81 and a punch 82 corresponding thereto is used. In the embodiment, a precut process and a trimming process are performed in this order.

In the precut process, as shown in the left drawing in FIG. 21A, the die 81 having a through hole 81a with a circular opening is used, in which the portion of the plate member 70 on the projecting portion 18a side is put into the through hole 81a. Then, in this state, the punch 82 is press fitted into the plate member 70 in a cylindrical shape with a bottom to reduce the thickness of the portion to cut.

Subsequently, in the trimming process, as shown in the left drawing in FIG. 21B, the die 81 having a through hole 81b with a circular opening is used, in which the portion of the plate member 70 on the projecting portion 18a side after the precut process is put into the through hole 81b. Then, in this state, the punch 82 is press fitted into the plate member 70 in a cylindrical shape with a bottom. Here, as the punch 82 for use in the trimming process, a punch having a cutting edge at the edge thereof is used. Therefore, the punch 82 is press fitted into the plate member 70, and then the plate member 70 can be cut at the preset cutting position. Thus, as shown in the right drawing in FIG. 21B, the case 3 can be obtained which has the projecting portion (the second outer lead portion 18) of predetermined dimensions formed in one piece. The case 3 thus obtained had a thickness (plate thickness) of about 0.05 µm in the cylindrical portion. In addition, plating applied on the surface remained as a plating film as it is, not removed.

In addition, in the case fabricating process step S30, since the plate member 70 continued long in a belt shape is prepared in the plate member preparing step S31 particularly, in the blanking step S32, the deep drawing step S33, the step drawing step S34, the adjusting step S35, and the cutting step S36 after that, the work area 71 of the plate member 70 is in turn transferred to each of the tools corresponding to each of the processes, whereby these processes can be performed continuously. Therefore, the processes can be automated highly efficiently (at high speed).

Figure 22A:
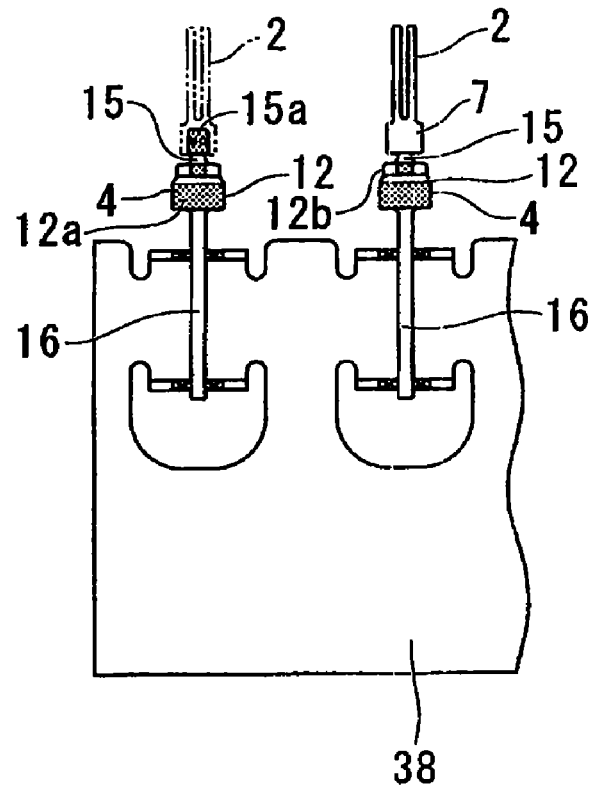
FIGS. 22A and 22B each show an illustration depicting a first mounting step in the fabrication process steps of the piezoelectric oscillator according to the first embodiment of the invention.
Figure 22B:
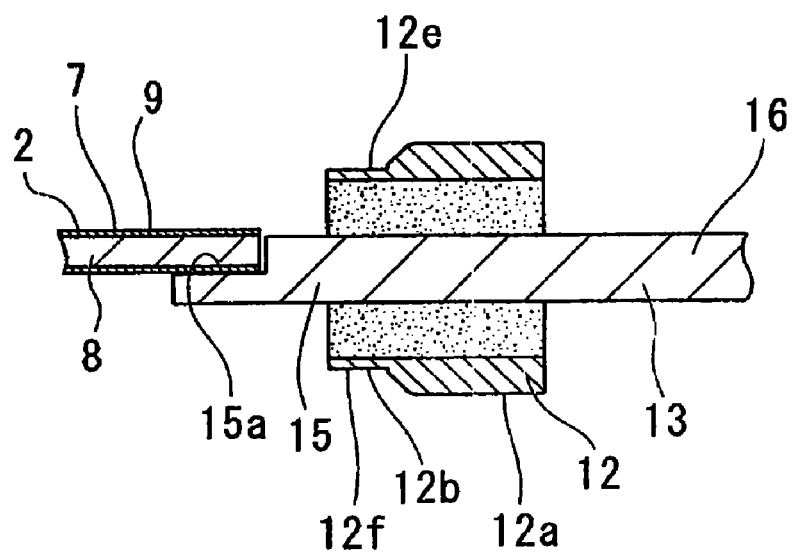

Subsequently, as the assembly process step S40, the piezoelectric vibrating piece 2, the case 3, and the hermetic terminal 4, which are obtained in the individual processes, are assembled. First, as a first mounting step S41, as shown in FIGS. 22A and 22B, in the palette 38, the piezoelectric vibrating piece 2 is mounted on the inner lead portion 15 of each of the hermetic terminals 4. In other words, the piezoelectric vibrating piece 2 prepared in the piezoelectric vibrating piece producing process step S10 is taken out of the dedicated palette 30. Then, the first excitation electrode 8 of the taken piezoelectric vibrating piece 2 is connected to the gold plated bump connecting portion 15a in the first excitation electrode 8 of the piezoelectric vibrating piece 2 in the base portion 7. For the conditions of bump connection, for example, the mounting temperature is 130° C., the bonding load is 0.5 N, and the load time is about $15 \times 10^{-3}$ seconds. Thus, the first excitation electrode of the piezoelectric vibrating piece 2 is electrically connected to the lead 13, and the piezoelectric vibrating piece 2 is supported by the inner lead portion 15 of the lead 13 in an open-sided shape. Here, since the portion on which the piezoelectric vibrating piece 2 is connected through a bump in the inner lead portion 15 of the lead 13 is formed nearly flat as the bump connecting portion 15a, the first excitation electrode 8 can more reliably conduct to the lead 13, as well as the piezoelectric vibrating piece 2 can be supported by the lead 13. In addition, since the bump connecting portion 15a is flattened to the position almost the same as the center axis of the lead 13, the piezoelectric vibrating piece 2 can be joined to the lead 13 at the position almost the same as the center axis of the lead 13.

Figure 23A:
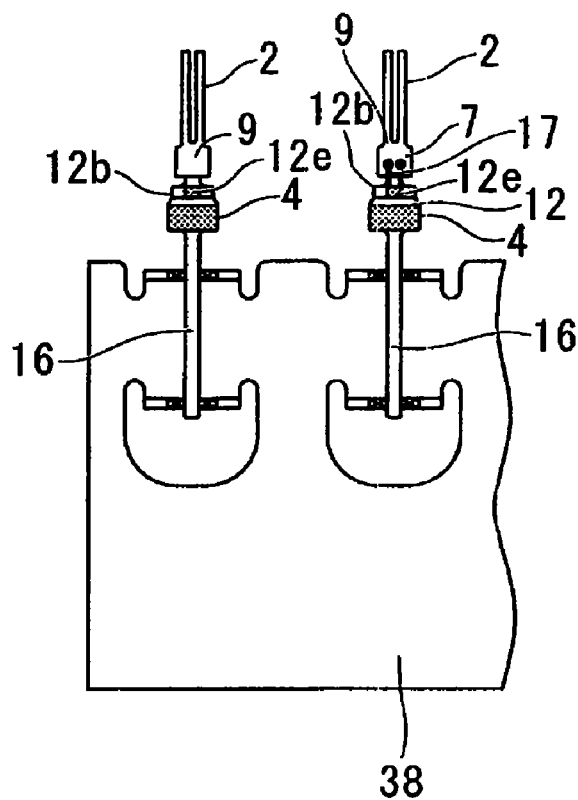
FIGS. 23A and 23B each show an illustration depicting a second mounting step in the fabrication process steps of the piezoelectric oscillator according to the first embodiment of the invention.
Figure 23B:
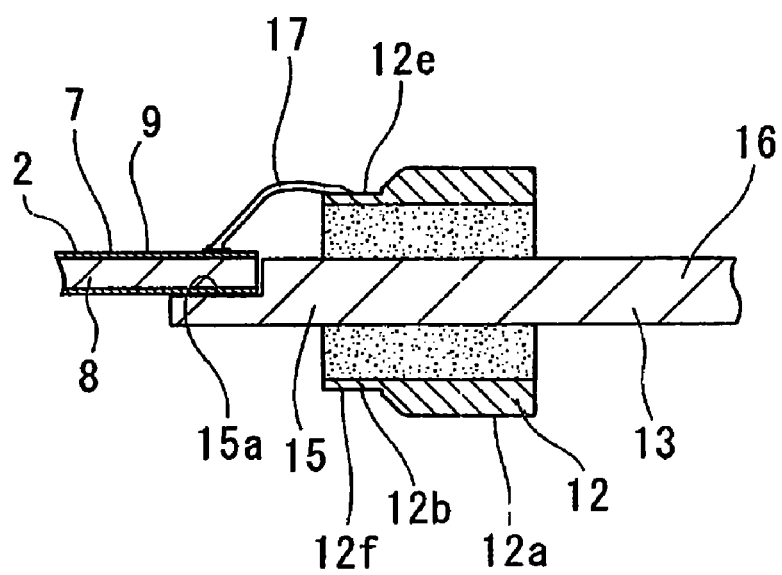

Subsequently, as a second mounting step S42, as shown in FIGS. 23A and 23B, the step portion 12e selected from the two step portions 12e and 12f of the ring 12 in each of the hermetic terminals 4 is wire bonded to the second excitation electrode 9 of the piezoelectric vibrating piece 2 mounted on each of the hermetic terminals 4. In the embodiment, two wires 17 are bonded between the step portion 12e and the second excitation electrode 9. For the wire 17 for use, for example, a gold (Au) line is selected, one end of the wire 17 is bonded to the second excitation electrode 9 in the base portion 7 of the piezoelectric vibrating piece 2, and then the other end is bonded to the step portion 12e of the ring 12. For the individual conditions for wire bonding, for example, the mounting temperature is 130° C., the wire diameter is 25 µm, the ball diameter is 80 to 85 µm, the ball thickness if 13 µm, and the shear strength is from 0.45 to 0.53 N; the bonding load is 0.55 N in bonding to the second excitation electrode 9, and the load time is $7 \times 10^{-3}$ seconds; and the bonding load is 0.4 N, and the load time is about $5 \times 10^{-3}$ seconds in bonding to the step portion 12e. Thus, the second excitation electrode 9 of the piezoelectric vibrating piece 2 is electrically connected to the ring 12. Here, in the outer side surface of the reducing portion 12b, the second excitation electrode 9 is bonded to the nearly flat step portion 12e, whereby conductivity can be ensured. Particularly, the second excitation electrode 9 is connected with a plurality of the wires 17, whereby conductivity can be more ensured. In addition, the filling member 14 having the insulating properties is interposed between the lead 13 connected to the first excitation electrode 8 and the ring 12 connected to the second excitation electrode 9 to provide insulation therebetween, whereby the first excitation electrode 8 of the piezoelectric vibrating piece 2 is insulated from the second excitation electrode 9 to prevent short circuits.

Figure 24:
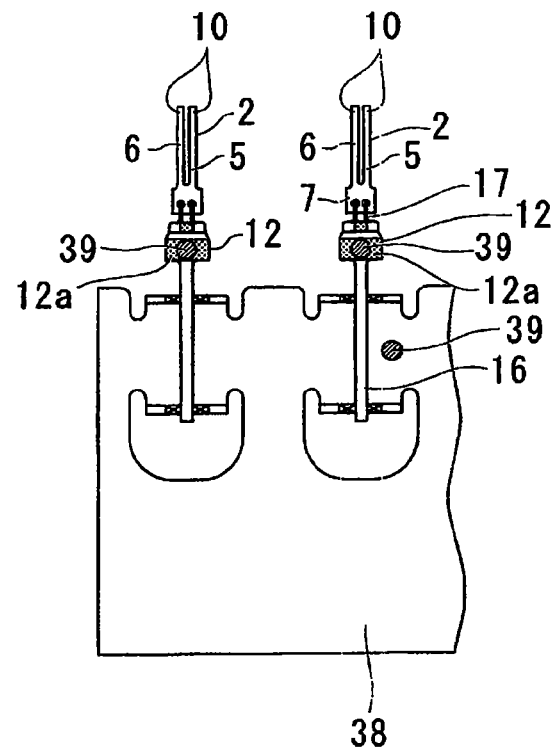
FIG. 24 shows an illustration depicting a fine tuning step in the fabrication process steps of the piezoelectric oscillator according to the first embodiment of the invention.

Subsequently, as a fine tuning step S43, the piezoelectric vibrating piece 2 is finely tuned. In other words, as shown in FIG. 24, in the vacuum atmosphere, an electrode is contacted with a contact 39 provided on the outer side surface of the press fitting portion 12a of the ring 12 and on the palette 38, and voltage is applied thereon, whereby the oscillating arm portions 5 and 6 of the piezoelectric vibrating piece 2 are oscillated. Then, the frequencies of the oscillating arm portions 5 and 6 are measured while a laser beam is applied onto the fine tuning part 10 to evaporate the metal film forming the fine tuning part 10, whereby the piezoelectric vibrating piece 2 is finely tuned so that the vibrations of the oscillating arm portions 5 and 6 of the piezoelectric vibrating piece 2 can be a predetermined resonance frequency.

Figure 25:
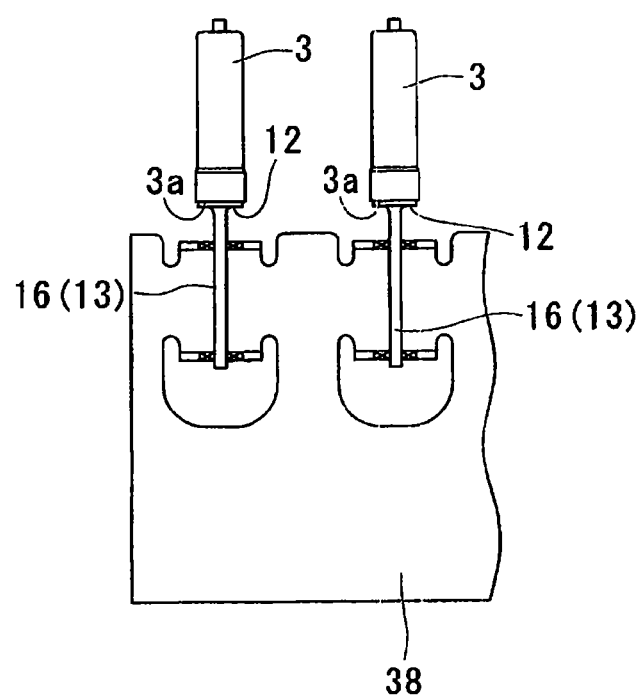
FIG. 25 shows an illustration depicting a press fitting step in the fabrication process steps of the piezoelectric oscillator according to the first embodiment of the invention
Figure 26:
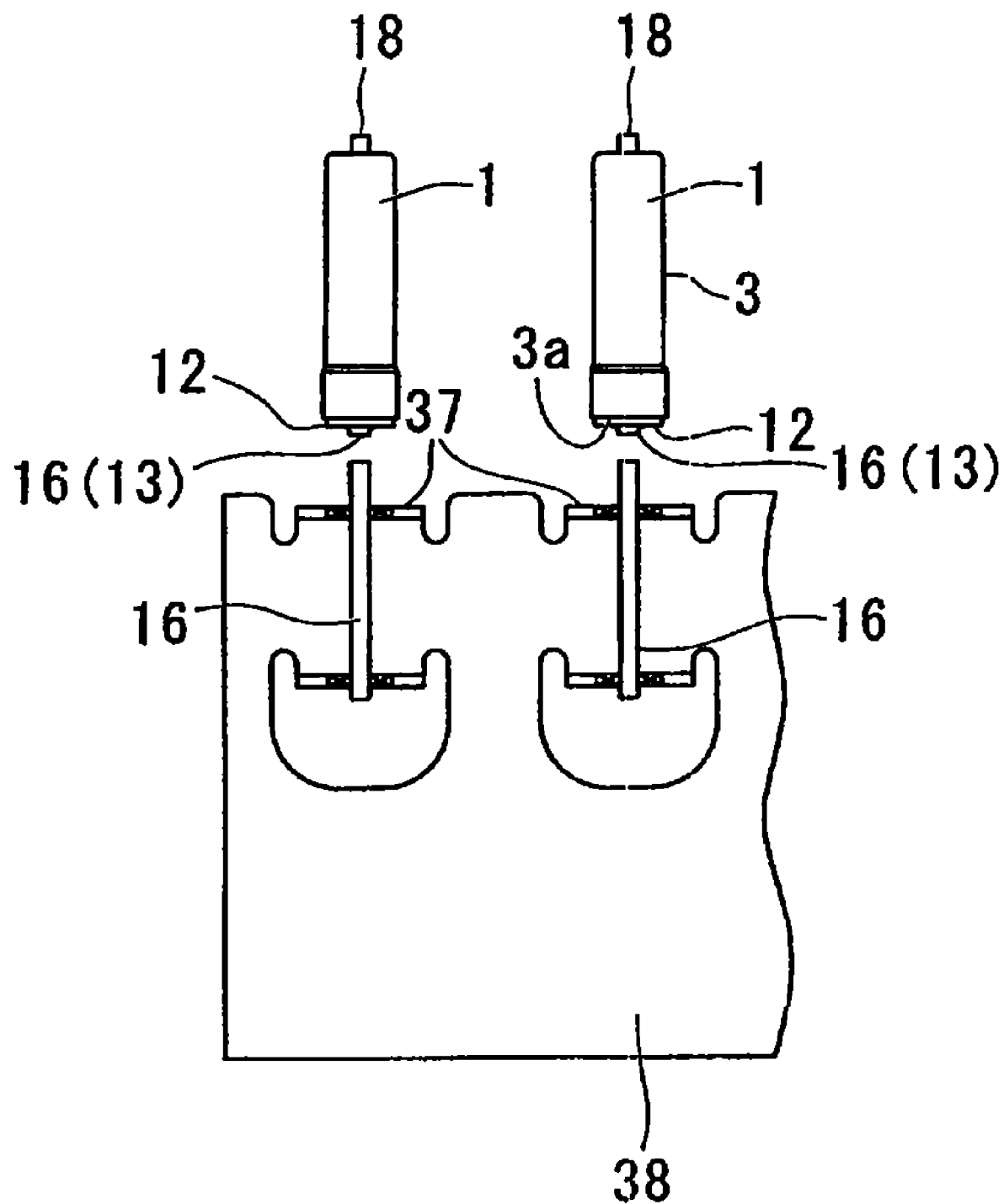
FIG. 26 shows an illustration depicting a separating step in the fabrication process steps of the piezoelectric oscillator according to the first embodiment of the invention

Subsequently, as a press fitting step S44, as shown in FIG. 25, in the vacuum atmosphere, each of the piezoelectric vibrating pieces 2 is inserted from the opening 3a of the case 3 formed in a predetermined shape in advance, and the ring 12 of the hermetic terminal 4 is press fitted into the case 3, whereby the piezoelectric vibrating piece 2 is hermetically sealed in the case 3. Thus, the piezoelectric vibrating piece 2 is hermetically sealed inside the case 3. Lastly, as a separating step S45, as shown in FIG. 26, in the first outer lead portion 16 of the lead 13, the portion fitted into the hermetic terminal arranging part 37 of the palette 38 is separated, and then the piezoelectric oscillator 1 is completed.

As described above, in the piezoelectric oscillator 1 according to in the embodiment, for the first excitation electrode 8 and the second excitation electrode 9 of the piezoelectric vibrating piece 2 arranged in the case 3, the first excitation electrode 8 can externally conduct through the first outer lead portion 16 of the lead 13, and the second excitation electrode 9 can externally conduct the second outer lead portion 18 of the case 3 through the ring 12 and the case 3 with no short circuits with each other. Here, the second excitation electrode 9 can be connected to the step portion 12e formed in the reducing portion 12b by providing the wire 17 with the use of the clearance 12d formed between the inner side surface of the case 3 and the step portion 12e of the ring 12, and the outer diameters of the case 3 and the ring 12 will not become larger. In addition, since the ring 12 has a simple structure including the press fitting portion 12a, the reducing portion 12b, and the two step portions 12e and 12f, even though the outer diameter thereof is reduced, the ring 12 can be readily formed by press working. On this account, in the piezoelectric oscillator 1 according to in the embodiment, the size can be reduced while short circuits can be prevented, and the piezoelectric oscillator 1 can be readily fabricated with excellent yields. In addition, the piezoelectric vibrating piece 2 is arranged at the position almost the same as the center axis of the lead 13 by the nearly flat bump connecting portion 15a, whereby the piezoelectric vibrating piece 2 can be arranged at the position almost the same as the center axis L3 of the case 3 together with the lead 13. Therefore, the distance between the inner side surface of the case 3 and the piezoelectric vibrating piece 2 can be set to the minimum length depending on the range in which the piezoelectric vibrating piece 2 is displaced, and thus the case 3 and the ring 12 can be further reduced in size.

In addition, since the case 3 has the second outer lead portion 18 (projecting portion) formed in one piece through the deep drawing step and the step drawing step, the soldering step before is not required. Therefore, since the case 3 is readily fabricated, the piezoelectric oscillator 1 including the case 3 can be readily fabricated as well.

In addition, in the embodiment, particularly in the case fabricating process step S30, the length of the projecting portion 18a (the second outer lead portion 18) to be produced is adjusted by subjecting the projecting portion 18a to the step drawing step S34 and then the adjusting step S35. However, the adjusting step S35 may be omitted as long as the length and thickness (outer diameter) of the projecting portion 18a obtained in the step drawing step S34 can be formed in desired dimensions.

Second Embodiment

Figure 27:
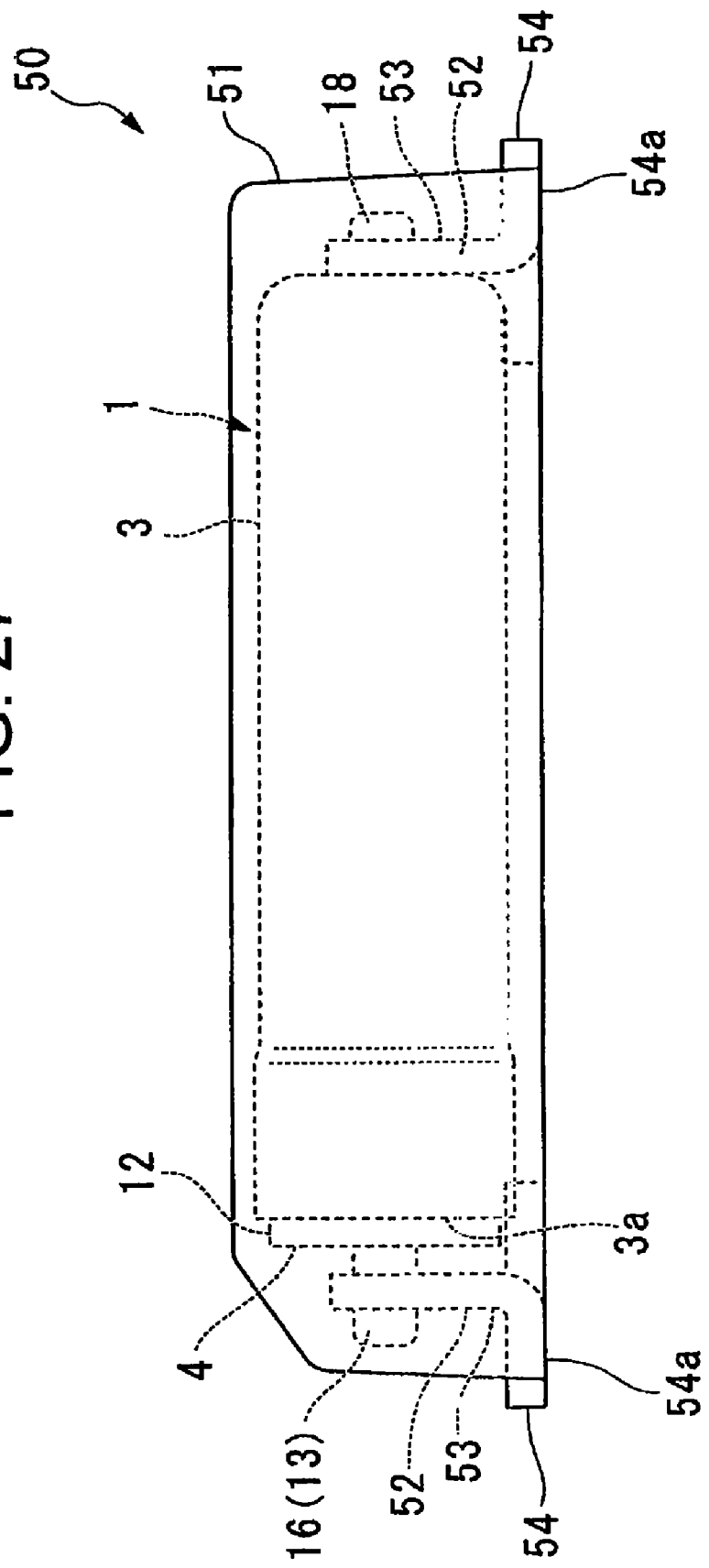
FIG. 27 shows a side view depicting a piezoelectric oscillator according to a second embodiment of the invention.
Figure 28:
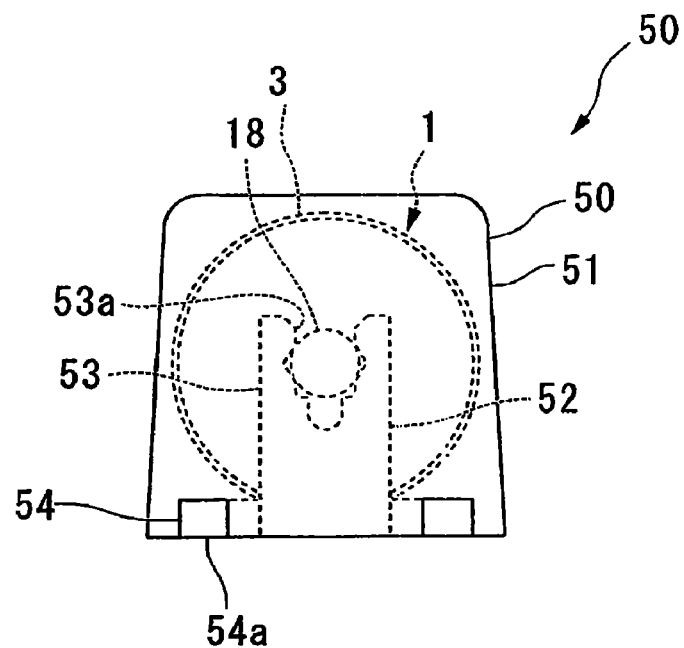
FIG. 28 shows a front view depicting the piezoelectric oscillator according to the second embodiment of the invention.

FIG. 27 and FIG. 28 each show a second embodiment of the invention. In the embodiment, the members overlapping with the members used in the embodiment described above are designated the same numerals and signs, omitting explanations.

As shown in FIG. 27 and FIG. 28, this piezoelectric oscillator 50 according to the embodiment is a surface mounted piezoelectric oscillator in which the piezoelectric oscillator 1 according to the first embodiment is resin molded. More specifically, the piezoelectric oscillator 50 includes a case 3, a hermetic terminal 4 which hermetically seals an opening 3a of the case 3, a piezoelectric vibrating piece 2, not shown, arranged inside the case 3, and a resin body 51 which is formed of a resin for covering the case 3, a first outer lead portion 16 and a second outer lead portion 18. To each of the first outer lead portion 16 and the second outer lead portion 18, an external terminal 52 is connected. The external terminal 52 includes a fitting portion 53 having a V-shape groove 53a into which the first outer lead portion 16 or the second outer lead portion 18 are fit, and an external connecting part 54 provided at the lower end of the fitting portion 53 and having a face 54a exposed outside the resin body 51.

Also in the piezoelectric oscillator 50 like this, the excitation electrodes, not shown, provided on both surfaces of the piezoelectric oscillator are not short circuited to each other, and the size can be reduced, as well as the piezoelectric oscillator 50 can be readily fabricated. For example, for the outer shape of the resin body 51, such a piezoelectric oscillator can be implemented in which one side is 1.1 μm or below in the cross section and the length is 4.3 μm or below. On this account, the piezoelectric oscillator 50 can be mounted on a substrate with a smaller space, and the space on the substrate can be saved.

Third Embodiment

Figure 29:
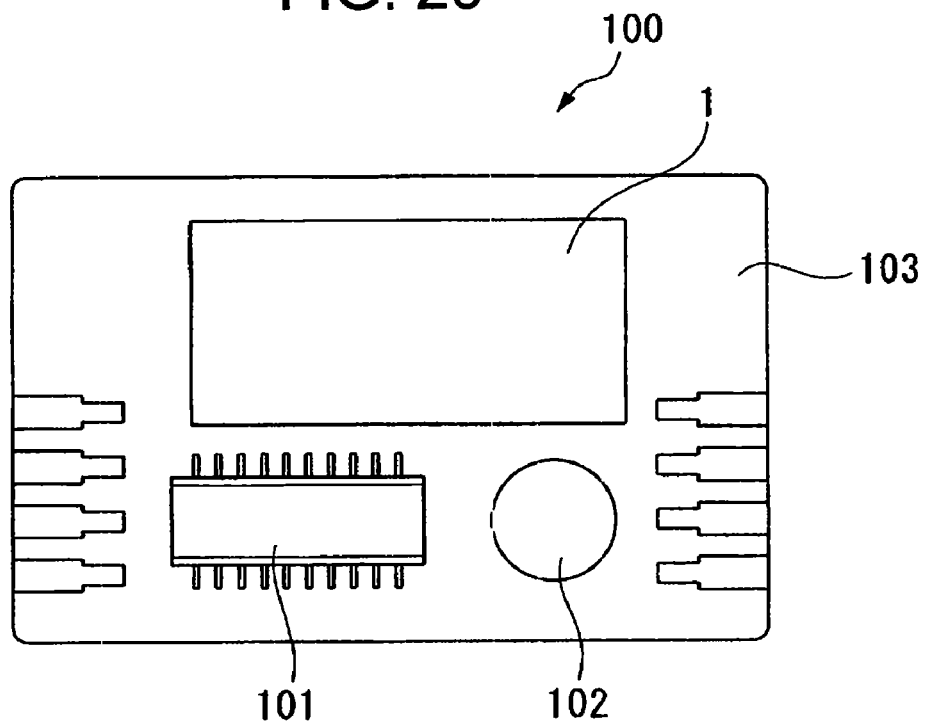
FIG. 29 shows a schematic diagram depicting an oscillator according to a third embodiment of the invention.

FIG. 29 shows a third embodiment of the invention. In the embodiment, the members overlapping with the members used in the embodiment described above are designated the same numerals and signs, omitting explanations.

FIG. 29 shows a schematic diagram depicting the configuration of a tuning fork quartz crystal oscillator according to the invention, showing a plan view depicting a surface mounted piezoelectric oscillator using the piezoelectric oscillator discussed above. As shown in FIG. 29, in this oscillator 100 according to the embodiment, a cylinder package piezoelectric oscillator 1 is configured as an oscillating element electrically connected to an integrated circuit 101. In addition, the piezoelectric oscillator 1 is the same as that of the first embodiment, omitting the explanations. The oscillator 100 has a substrate 103 on which an electronic component 102 such as a condenser is mounted. The substrate 103 is mounted with the integrated circuit 101 for the oscillator, and the piezoelectric oscillator 1 is mounted near the integrated circuit 101. The electronic component 102, the integrated circuit 101 and the piezoelectric oscillator 1 are electrically connected to each other through a wiring pattern, not shown. In addition, the individual components are molded with a resin, not shown.

In the oscillator 100 thus configured, voltage is applied to the piezoelectric oscillator 1, a piezoelectric vibrating piece 2 in the piezoelectric oscillator 1 is oscillated, and the vibrations are converted into electric signals by the piezoelectric property of quartz crystal and inputted to the integrated circuit 101 as electric signals. The inputted electric signals are processed variously by the integrated circuit 101, and outputted as frequency signals. Thus, the piezoelectric oscillator 1 functions as an oscillating element. In addition, for example, in the configuration of the integrated circuit 101, an RTC (real time clock) module is selectively set in accordance with demands, whereby in addition to a single-function oscillator for clocks, such a function can be added that controls the operation dates and times of the oscillator and external devices or provides times and calendars.

As discussed above, in accordance with the oscillator 100 according to the embodiment, the small-sized piezoelectric oscillator 1 with no short circuits is included to provide a small-sized, highly reliable oscillator.

In addition, the oscillator 100 is described as it includes the cylinder package piezoelectric oscillator 1, but which is not limited thereto, and which may include the surface mounted package piezoelectric oscillator 50 shown in the second embodiment, for example.

Fourth Embodiment

Figure 30:
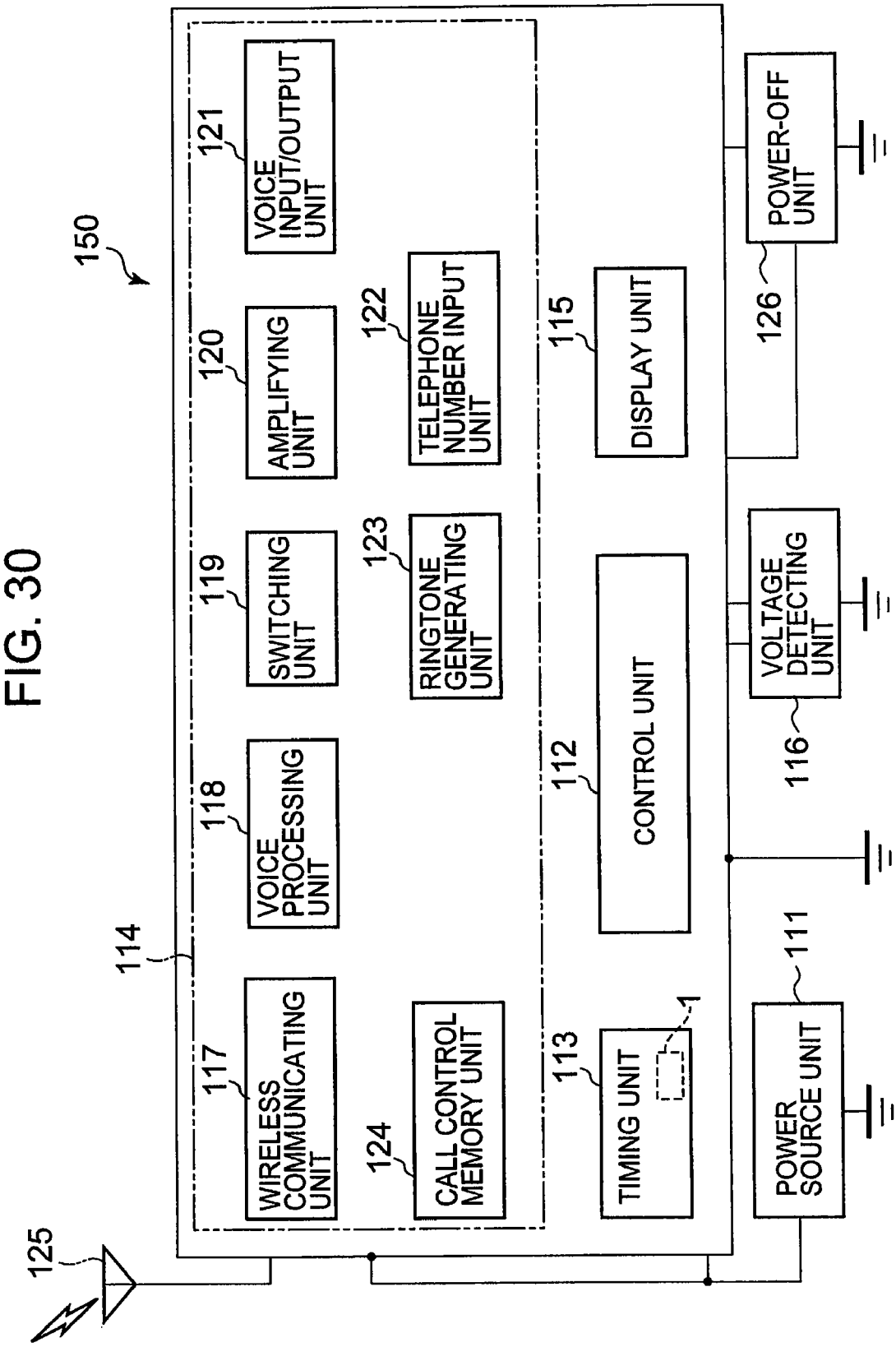
FIG. 30 shows a block diagram depicting an electronic appliance according to a fourth embodiment of the invention.
Figure 31:
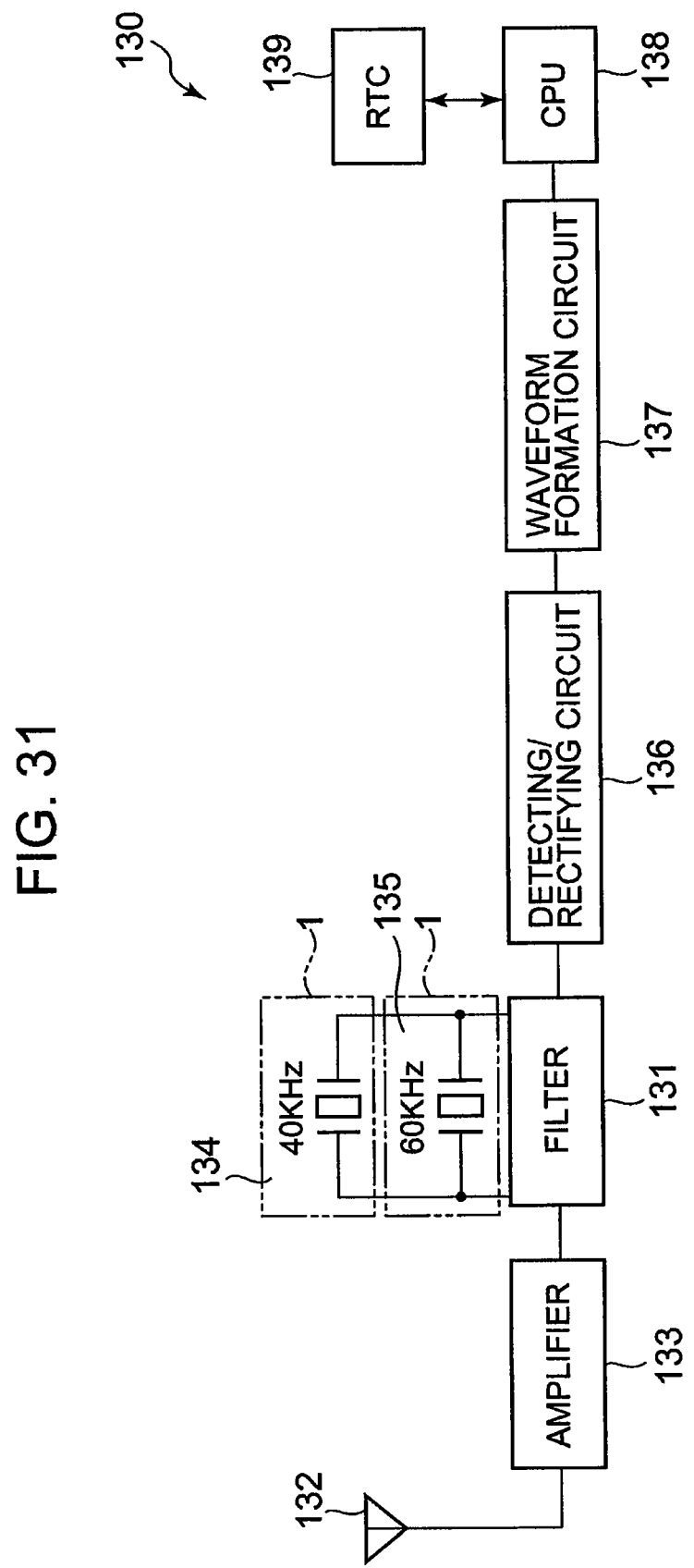
FIG. 31 shows a block diagram depicting a radio clock according to a fifth embodiment of the invention.

FIG. 30 shows a fourth embodiment of the invention. In the embodiment, the members overlapping with the members used in the embodiment described above are designated the same numerals and signs, omitting explanations.

In the embodiment, as an electronic appliance, a portable information device having the piezoelectric oscillator 1 described above is taken and described as an example. FIG. 30 shows a block diagram depicting the configuration of this electronic appliance. As shown in FIG. 30, the portable information device 110 according to the embodiment has the piezoelectric oscillator 1 and a power supply part 111 for supplying electric power. For example, the power supply part 111 is configured of a lithium secondary battery. To the power supply part 111, the following functional blocks are connected in parallel with each other: a control part 112 which performs various controls, a clock part 113 which counts time, a communicating part 114 which communicates with external devices, a display part 115 which displays various items of information, and a voltage detecting part 116 which detects voltage in the individual functional blocks. Then, the power supply part 111 supplies electric power to the individual functional blocks.

The control part 112 controls the individual functional blocks to perform operation control over the entire system such as sending and receiving sound data, measuring current time, and display. In addition, the control part 112 has a ROM in which a program is written in advance, a CPU which reads and performs the program written in the ROM, and a RAM used as the work area for the CPU.

The clock part 113 has an integrated circuit having an oscillation circuit therein, a register circuit, a counter circuit and an interface circuit and the piezoelectric oscillator 1. Voltage is applied to the piezoelectric oscillator 1, the piezoelectric vibrating piece 2 is then oscillated, and the vibrations are converted into electric signals by the piezoelectric property of quartz crystal, and inputted to the oscillation circuit as electric signals. The output of the oscillation circuit is binarized, and counted by the register circuit and the counter circuit. Then, through the interface circuit, signals are sent and received with the control part 112, and the current time and current date or calendar information are displayed on the display part 115.

The communicating part 114 has a function similar to that of a mobile telephone before, including a radio part 117, a sound processing part 118, a switching part 119, an amplifying part 120, a sound input/output part 121, a telephone number input part 122, a ringtone generating part 123 and a call control memory part 124. The radio part 117 sends and receives various items of data such as sound data with a base station through an antenna 125. The sound processing part 118 encodes and decodes sound signals inputted from the radio part 117 or the amplifying part 120. The amplifying part 120 amplifies the signals inputted from the sound processing part 118 or the sound input/output part 121 to a predetermined level. The sound input/output part 121 is configured of a speaker and a microphone, which makes a ringtone or a received call loud or collects sounds.

In addition, the ringtone generating part 123 generates a ringtone in response to calling from the base station. The switching part 119 switches the amplifying part 120 connected to the sound processing part 118 to the ringtone generating part 123 only when a call is received, whereby the ringtone generated in the ringtone generating part 123 is outputted to the sound input/output part 121 through the amplifying part 120. In addition, the call control memory part 124 stores therein a program for control of calling and called communications. In addition, the telephone number input part 122 has number keys 0 to 9 and other keys, for example, and these number keys are pressed to input the telephone number of a destination call.

In the case in which voltage applied to the individual functional blocks such as the control part 112 by the power supply part 111 is below a predetermined value, the voltage detecting part 116 detects this voltage drop and informs the control part 112 of the voltage drop. A predetermined voltage value at this time is a preset value as the minimum voltage necessary to stably operate the communicating part 114, for example, about 3 V. The control part 112 informed of the voltage drop from the voltage detecting part 116 disables the operations of the radio part 117, the sound processing part 118, the switching part 119 and the ringtone generating part 123. Particularly, it is required to stop the operation of the radio part 117 of large power consumption. Moreover, the display part 115 displays that the communicating part 114 is disabled for use because of battery shortage.

In other words, the voltage detecting part 116 and the control part 112 can disable the operation of the communicating part 114, and show this on the display part 115. This representation may be a text message, and for more intuitive representation, an X (cross) mark may be put on a telephone icon shown on the upper part of the display surface of the display part 115. In addition, the portable information device 110 has a power source breaker 126 which can selectively shut down the power source for the function of the communicating part 114, and the power source breaker 126 reliably disables the function of the communicating part 114.

In accordance with the portable information device 110 according to the embodiment, the small-sized piezoelectric oscillator 1 with no short circuits is included to provide a small-sized, highly reliable portable information device.

In addition, the portable information device 110 is described as it includes the cylinder package piezoelectric oscillator 1, but which is not limited thereto. For example, it may include the surface mounted package piezoelectric oscillator 50 shown in the second embodiment. The packaged piezoelectric oscillator 50 is preferable because it can be connected on a printed wiring board by reflow soldering together with other electronic components at the same time.

Fifth Embodiment

FIG. 30 shows a fifth embodiment of the invention. In the embodiment, the members overlapping with the members used in the embodiment described above are designated the same numerals and signs, omitting explanations.

In the embodiment, as an embodiment of a radio clock, a radio clock which has the piezoelectric oscillator 1 described above will be described. FIG. 30 shows a block diagram depicting the configuration of the radio clock. As shown in FIG. 30, the radio clock 130 according to the embodiment has the piezoelectric oscillator 1 electrically connected to a filter part 131, which is a clock having a function that receives standard radio waves including clock information and automatically corrects the radio waves to accurate time for display. In Japan, there are two transmitting stations (sending station) that send standard radio waves in Fukushima prefecture (40 kHz) and Saga prefecture (60 kHz), each sending standard radio waves. Since a long wave of 40 kHz or 60 kHz has a property of propagating through the earth's surface as well as a property of propagating while reflected in ionospheric layers and the earth's surface, the wave has a wide propagating area, covering throughout Japan with the two transmitting stations.

An antenna 132 receives standard radio waves of a 40 kHz or 60 kHz long wave. Standard radio waves of the long wave are waves in which time information called time code is amplitude modulated to a carrier wave of 40 kHz or 60 kHz. The received standard radio waves of the long wave are amplified by an amplifier 133, and filtered and tuned by the filter part 131 having a plurality of the piezoelectric oscillators 1. In addition, as the piezoelectric oscillator 1, piezoelectric oscillator parts 134 and 135 are provided having resonance frequencies of 40 kHz and 60 kHz, respectively, the same as the carrier frequencies.

Moreover, the filtered signals at a predetermined frequency are detected and demodulated by a detector and rectifier circuit 136. Then, the time code is taken out through a waveform shaping circuit 137, and counted by a CPU 138. The CPU 138 reads information such as the current year, the day of a year, the day of a week, and time. The read information is reflected in a RTC 139, and accurate time information is displayed. Since the carrier wave is 40 kHz or 60 kHz, preferably, the piezoelectric oscillator parts 134 and 135 are the piezoelectric oscillator having the tuning fork structure described above. In the example of 60 kHz, for exemplary dimensions of a tuning fork oscillator piece, it can be configured in such dimensions that the overall length is about 2.8 µm, and the width dimension of the base portion is about 0.5 µm.

In accordance with the radio clock 130 according to the embodiment, the small-sized piezoelectric oscillator 1 with no short circuits is included to provide a small-sized, highly reliable radio clock.

In addition, the radio clock 130 is described as it includes the cylinder package piezoelectric oscillator 1, but which is not limited thereto. For example, it may include the surface mounted package piezoelectric oscillator 50 shown in the second embodiment.

As discussed above, the embodiments of the invention have been described in detail with reference to the drawings. The vibration mode is not limited to bending oscillation of the tuning fork, which may be other vibration mode such as the thickness-shear vibration mode by other vibrating pieces. In addition, the material for a piezoelectric product is not limited to quartz crystal, which may be piezoelectric materials such as lithium niobate, lithium tantalate, and langasite. Moreover, the specific configuration is not limited to these embodiments, which includes design modifications within the scope not deviating from the teachings of the invention.

What is claimed is:

1. A piezoelectric oscillator comprising:
a piezoelectric vibrating piece,
a case having a cavity accommodating the piezoelectric vibrating piece therein;
a hermetic terminal having an annular ring, a lead arranged to penetrate through the ring in which one end side thereof comprises an inner lead portion electrically connected to the piezoelectric vibrating piece and the other end side thereof comprises an outer lead portion providing a first external electrical connection and a filler fixing the lead to the ring, wherein the hermetic terminal seals the piezoelectric vibrating piece inside the case; and
a projecting portion integral with the case and electrically coupled to the piezoelectric vibrating piece, the projecting portion providing a second external electrical connection.

2. An oscillator comprising:
the piezoelectric oscillator according to claim 1 connected to an integrated circuit as an oscillating element.

3. An electronic appliance comprising:
the piezoelectric oscillator according to claim 1.

4. A radio clock comprising:
the piezoelectric oscillator according to claim 1 electrically connected to a filter part.

5. The piezoelectric oscillator of claim 1 further comprising;
a first electrode on the piezoelectric vibrating piece; and
a second electrode on the piezoelectric vibrating piece,
wherein the lead is electrically coupled to the first electrode and the projecting portion is electrically coupled to the second electrode.

* * * * *